United States Patent
Xie et al.

(10) Patent No.: US 12,268,016 B2
(45) Date of Patent: Apr. 1, 2025

(54) BURIED POWER RAIL FORMATION FOR VERTICAL FIELD EFFECT TRANSISTORS

(71) Applicant: International Business Machines Corporation, Armonk, NY (US)

(72) Inventors: Ruilong Xie, Niskayuna, NY (US);
Junli Wang, Slingerlands, NY (US);
Brent A Anderson, Jericho, VT (US);
Chen Zhang, Guilderland, NY (US);
Heng Wu, Guilderland, NY (US);
Alexander Reznicek, Troy, NY (US)

(73) Assignee: International Business Machines Corporation, Armonk, NY (US)

(*) Notice: Subject to any disclaimer, the term of this patent is extended or adjusted under 35 U.S.C. 154(b) by 580 days.

(21) Appl. No.: 17/564,571

(22) Filed: Dec. 29, 2021

(65) Prior Publication Data
US 2023/0207697 A1    Jun. 29, 2023

(51) Int. Cl.
*H10D 30/62* (2025.01)
*H01L 23/522* (2006.01)
(Continued)

(52) U.S. Cl.
CPC ..... *H10D 30/6211* (2025.01); *H01L 23/5226* (2013.01); *H01L 23/5286* (2013.01); *H10D 64/018* (2025.01)

(58) Field of Classification Search
CPC ........... H10D 30/6211; H10D 30/0318; H10D 30/689; H10D 64/018; H10D 84/135;
(Continued)

(56) References Cited

U.S. PATENT DOCUMENTS

| 6,492,244 B1 | 12/2002 | Christensen |
| 6,498,057 B1 | 12/2002 | Christensen |

(Continued)

FOREIGN PATENT DOCUMENTS

| JP | 2005032839 A | 2/2005 |
| TW | 202022990 A | 6/2020 |

OTHER PUBLICATIONS

Gupta, et al., "High-Aspect-Ratio Ruthenium Lines for Buried Power Rail," International Interconnect Technology Conference (IITC), 2018, pp. 4-6.
(Continued)

*Primary Examiner* — Dao H Nguyen
(74) *Attorney, Agent, or Firm* — Scott S. Dobson

(57) ABSTRACT

A channel fin extends vertically above a bottom source/drain region, a protective liner is positioned along opposite sidewalls of the bottom source/drain region. The bottom source/drain region is positioned above a semiconductor layer in contact with a first portion of an inner spacer. A first metal layer is positioned between the first portion of the inner spacer and a second portion of the inner spacer, the first portion of the inner spacer partially covers a top surface of the first metal layer and the second portion of the inner spacer substantially covers a bottom surface of the first metal layer for providing a buried power rail. A shallow trench isolation region is positioned above an exposed portion of the first metal layer, the shallow trench isolation region is adjacent to the first portion of the inner spacer, the semiconductor layer, and the bottom source/drain region.

20 Claims, 28 Drawing Sheets

(51) Int. Cl.
 *H01L 23/528* (2006.01)
 *H10D 64/01* (2025.01)
(58) Field of Classification Search
 CPC ............. H01L 23/5226; H01L 23/5286; H01L 23/535; H01L 21/743
 See application file for complete search history.

(56) References Cited

U.S. PATENT DOCUMENTS

| | | | |
|---|---|---|---|
| 7,002,187 | B1 | 2/2006 | Husher |
| 8,507,957 | B2 | 8/2013 | Hou |
| 9,570,395 | B1 | 2/2017 | Sengupta |
| 9,721,845 | B1 | 8/2017 | Cheng |
| 9,876,015 | B1* | 1/2018 | Balakrishnan .......... H10D 30/63 |
| 10,872,818 | B2 | 12/2020 | Chiang |
| 10,957,605 | B2* | 3/2021 | Zhang .................... H10D 84/83 |
| 11,948,974 | B2* | 4/2024 | Peng .................... H10D 62/121 |
| 2018/0145030 | A1 | 5/2018 | Beyne |
| 2018/0269329 | A1* | 9/2018 | Balakrishnan ...... H01L 29/7889 |
| 2018/0374791 | A1 | 12/2018 | Smith |
| 2019/0148376 | A1 | 5/2019 | Chanemougame |
| 2019/0157261 | A1* | 5/2019 | Balakrishnan ...... H01L 29/7827 |
| 2020/0194372 | A1 | 6/2020 | Cheng |
| 2020/0203276 | A1 | 6/2020 | Hiblot |
| 2020/0266169 | A1 | 8/2020 | Kang |
| 2020/0273756 | A1 | 8/2020 | Cheng |
| 2021/0217889 | A1 | 7/2021 | Waskiewicz |
| 2021/0280474 | A1 | 9/2021 | Wang |
| 2022/0102492 | A1* | 3/2022 | Gardner .............. H01L 27/0688 |
| 2022/0148969 | A1 | 5/2022 | Xie |
| 2022/0254925 | A1* | 8/2022 | Gardner .......... H01L 21/823885 |
| 2022/0293523 | A1* | 9/2022 | Gardner ............... H10D 84/016 |
| 2024/0113219 | A1* | 4/2024 | Anderson ........... H01L 29/7827 |

OTHER PUBLICATIONS

Hsu, et al., "Versatile Aqueous Chemistry for Selective Ru or WNx Etch and Implant BARC Removal in 5- and 3-nm Applications", Solid State Phenomena, vol. 282, Aug. 2018, Abstract only, 2 pages.

Ryckaert, et al., "Extending the roadmap beyond 3nm through system scaling boosters: A case study on Buried Power Rail and Backside Power Delivery," Electron Devices Technology and Manufacturing Conference (EDTM), 2019, pp. 50-52.

Salahuddin, et al., "SRAM With Buried Power Distribution to Improve Write Margin and Performance in Advanced Technology Nodes," IEEE Electron Device Letters, vol. 40, No. 8, Aug. 2019, pp. 1261-1264.

Disclosed Anonymously, "Method and Structure for Implementing Replacement/Buried Power Rail In VTFET", An IP.com Prior Art Database Technical Disclosure, IP.com No. IPCOM000260354D, Electronic Publication Date: Nov. 14, 2019, 6 pages.

International Searching Authority, "Notification of International Search Report and Written Opinion or Declaration", International Application No. PCT/EP2022/085048, Mailed Mar. 13, 2023, 14 pages.

* cited by examiner

Y - Y'

BURIED POWER RAIL FORMATION FOR VERTICAL FIELD EFFECT TRANSISTORS

BACKGROUND

The present invention generally relates to the field of semiconductor devices, and more particularly to vertical field-effect transistors (VFETs).

VFETs have been pursued as a potential device option for scaling complementary metal-oxide semiconductors (CMOS) to the 3 nanometer (nm) node and beyond. As opposed to planar CMOS devices, VFETs are oriented vertically with a vertical fin or nanowire that extends upward from the substrate. The fin or nanowire forms, the channel region of the transistor. A source region and a drain region are situated in electrical contact with the top and bottom ends of the channel region, while the gate is disposed on one or more of the fin or nanowire sidewalls. Thus, in VFETs the direction of the current flow between the source and drain regions is normal to the main surface of the substrate. As semiconductor devices continue to scale downward in size, there is oftentimes not enough room to form buried power rails in VFETs using conventional device architecture. Accordingly, improved designs and techniques for fabricating a VFET device with buried power rail would be desirable.

SUMMARY

According to an embodiment of the present disclosure, a semiconductor structure includes a channel fin extending vertically above a bottom source/drain region, a protective liner along opposite sidewalls of the bottom source/drain region, the bottom source/drain region located above a semiconductor layer in contact with a first portion of an inner spacer, a first metal layer located between the first portion of the inner spacer and a second portion of the inner spacer, the first portion of the inner spacer partially covering a top surface of the first metal layer and the second portion of the inner spacer substantially covering a bottom surface of the first metal layer for providing a buried power rail, and a shallow trench isolation region above an exposed portion of the first metal layer, the shallow trench isolation region being adjacent to the first portion of the inner spacer, the semiconductor layer, and the bottom source/drain region.

According to another embodiment of the present disclosure, a semiconductor structure includes a first region including a first channel fin extending vertically above a first bottom source/drain region, a second region including a second channel fin extending vertically above a second bottom source/drain region, the first region being separated from the second region by an isolation region, a protective liner along opposite sidewalls of each of the first bottom source/drain region and the second bottom/source drain region, each of the first bottom source/drain region and the second bottom/source drain region located above a semiconductor layer in contact with a first portion of an inner spacer, a first metal layer located between the first portion of the inner spacer and a second portion of the inner spacer, the first portion of the inner spacer partially covering a top surface of the first metal layer and the second portion of the inner spacer substantially covering a bottom surface of the first metal layer for providing a buried power rail, and a shallow trench isolation region above an exposed portion of the first metal layer, the shallow trench isolation region being adjacent to the first portion of the inner spacer, the semiconductor layer, and each of the first bottom source/drain region and the bottom source/drain region.

BRIEF DESCRIPTION OF THE DRAWINGS

The following detailed description, given by way of example and not intended to limit the invention solely thereto, will best be appreciated in conjunction with the accompanying drawings, in which.

The drawings are not necessarily to scale. The drawings are merely schematic representations, not intended to portray specific parameters of the invention. The drawings are intended to depict only typical embodiments of the invention. In the drawings, like numbering represents like elements.

DETAILED DESCRIPTION

Figure 1:
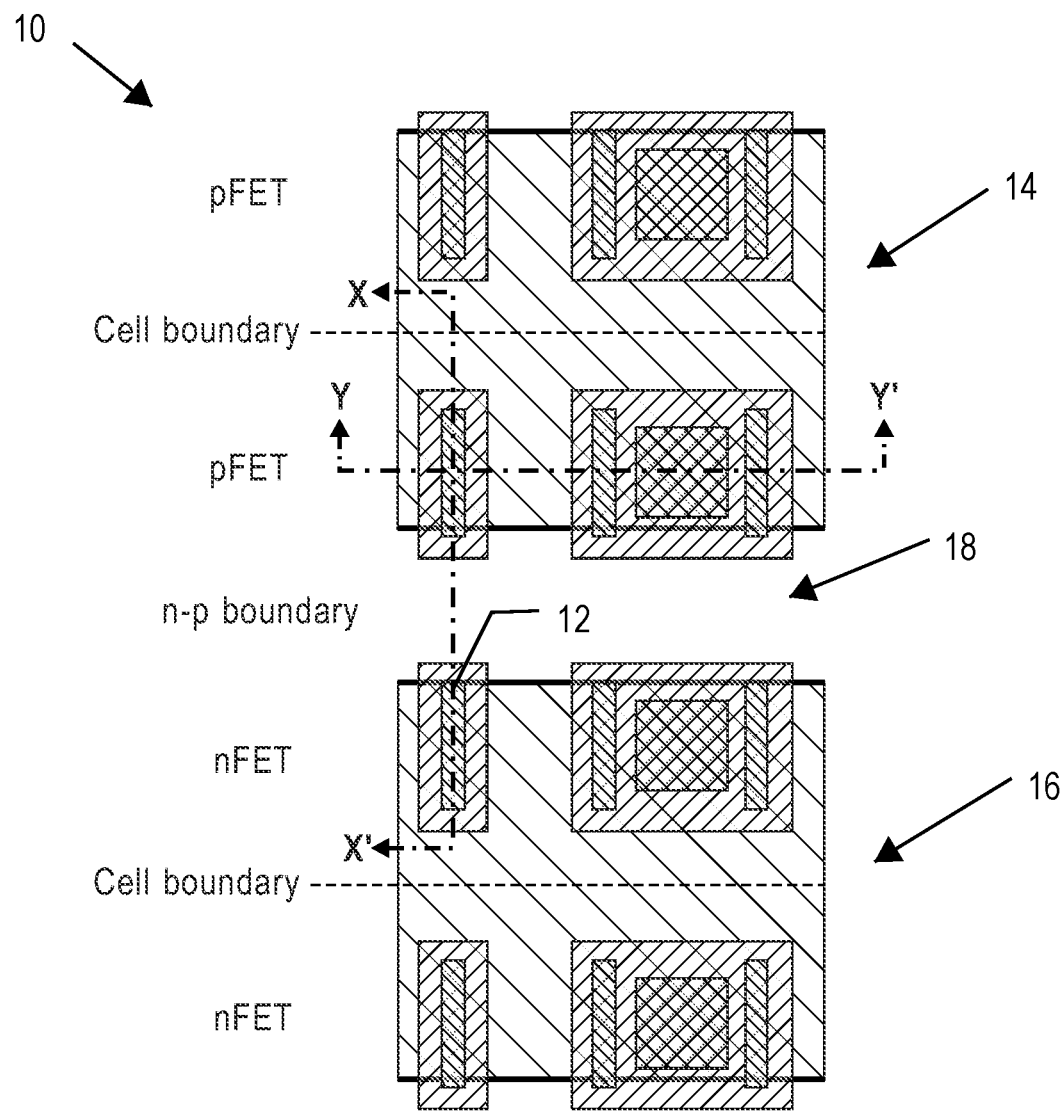
FIG. 1 is a top-down view of an exemplary semiconductor structure, according to an embodiment of the present disclosure.

Detailed embodiments of the claimed structures and methods are disclosed herein; however, it can be understood that the disclosed embodiments are merely illustrative of the claimed structures and methods that may be embodied in various forms. This invention may, however, be embodied in many different forms and should not be construed as limited to the exemplary embodiments set forth herein. In the description, details of well-known features and techniques may be omitted to avoid unnecessarily obscuring the presented embodiments.

For purposes of the description hereinafter, terms such as "upper", "lower", "right", "left", "vertical", "horizontal", "top", "bottom", and derivatives thereof shall relate to the disclosed structures and methods, as oriented in the drawing figures. Terms such as "above", "overlying", "atop", "on top", "positioned on" or "positioned atop" mean that a first element, such as a first structure, is present on a second element, such as a second structure, wherein intervening elements, such as an interface structure may be present between the first element and the second element. The term "direct contact" means that a first element, such as a first structure, and a second element, such as a second structure, are connected without any intermediary conducting, insulating or semiconductor layers at the interface of the two elements.

In the interest of not obscuring the presentation of embodiments of the present invention, in the following detailed description, some processing steps or operations that are known in the art may have been combined together for presentation and for illustration purposes and in some instances may have not been described in detail. In other instances, some processing steps or operations that are known in the art may not be described at all. It should be understood that the following description is rather focused on die distinctive features or elements of various embodiments of the present invention.

Typical buried power rail formation is conducted in the shallow trench isolation (STI) region of a semiconductor device. However, in advanced technologies with aggressive cell scaling, such as VFET, there is oftentimes not enough room to place the buried power rail in the STI region. Thus, embodiments of the present disclosure provides a VFET device, and a method of making the same, in which the buried power rail is formed underneath the active region(s) (e.g., source/drain regions) of the device with full device footprint.

An embodiment by which a VFET device having a buried power rail underneath the active region(s) can be formed is described in detailed below by referring to the accompanying drawings in FIGS. 1-23B.

Referring now to FIG. 1, a top-down view of an exemplary semiconductor structure 10 is shown, according to an embodiment of the present disclosure. Particularly, FIG. 1 depicts different cross-sectional views of the exemplary semiconductor structure 10 that will be used to describe embodiments of the present disclosure. The cross-sectional views are taken along line X-X' and line Y-Y'. As depicted in the figure, line X-X' represents a cut along a fin structure or fin region 12 of the exemplary semiconductor structure, and line Y-Y' represents a cut across the fin structure or fin region 12 of the semiconductor structure.

In this embodiment, the cross-sectional view taken along line X-X' includes a view of a p-FET region 14 of the exemplary semiconductor structure 10, an n-FET region 16 of the exemplary semiconductor structure 10 and an area (n-p boundary) 18 between these two regions. Further, the cross-sectional view taken along line Y-Y' includes a view of adjacent devices within the same p-FET or n-FET region of the exemplary semiconductor structure depicted in the figure.

Figure 2:
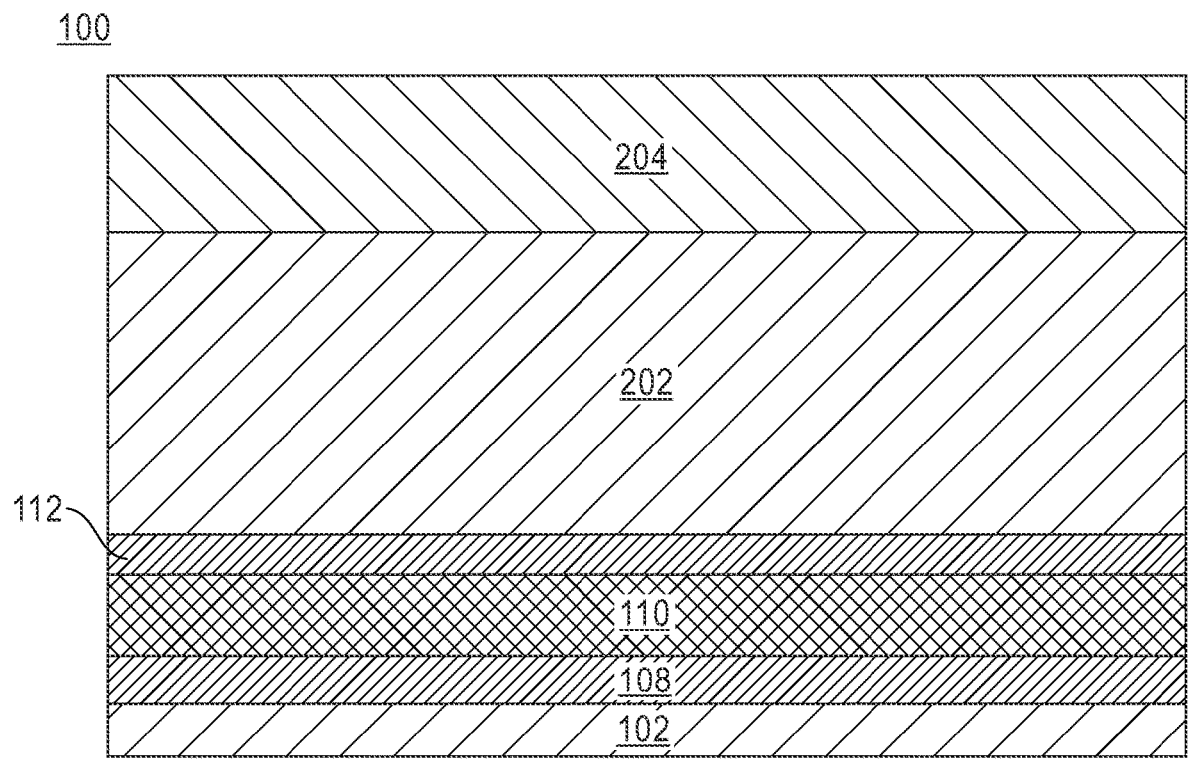
FIG. 2 is a cross-sectional view of a semiconductor structure taken along line X-X', as shown in FIG. 1, depicting forming a stack of semiconductor layers on a substrate, according to an embodiment of the present disclosure.

Referring now to FIG. 2, a cross-sectional view of a semiconductor structure 100 at an intermediate step during a semiconductor manufacturing process is shown, according to an embodiment of the present disclosure. Particularly, in the depicted example, the semiconductor structure 100 is shown after forming a stack of semiconductor layers on a substrate 102. In this embodiment, FIG. 2 is a cross-sectional view of the semiconductor structure 100 taken along line X-X', as depicted in FIG. 1.

The stack of semiconductor layers formed above the substrate 102 includes a first semiconductor layer 108 disposed above the substrate 102, a second semiconductor layer 110 disposed above the first semiconductor layer 108, a third semiconductor layer 112 disposed above the second semiconductor layer 110, and a fourth semiconductor layer 202 disposed above the third semiconductor layer 112. As depicted in the figure, a hardmask layer 204 is formed above the fourth semiconductor layer 202.

According to an embodiment, the stack of semiconductor layers includes a sequence of layers of semiconductor materials vertically stacked one on top of another in a direction perpendicular to the substrate 102, as illustrated in the figure. In the example depicted in the figure, the first, second and third semiconductor layers 108, 110, 112 are sacrificial semiconductor layers. The term sacrificial, as used herein, means a layer or other structure, that is (or a part thereof is) removed before completion of the final device.

According to an embodiment, the substrate 102 may be, for example, a bulk substrate, which may be made from any of several known semiconductor materials such as, for example, silicon, germanium, silicon-germanium alloy, and compound (e.g. III-V and II-VI) semiconductor materials. Non-limiting examples of compound semiconductor materials include gallium arsenide, indium arsenide, and indium phosphide, or indium gallium phosphide. Typically, the substrate 102 may be approximately, but is not limited to, several hundred microns thick. In other embodiments, the substrate 102 may be a layered semiconductor such as a silicon-on-insulator or SiGe-on-insulator, where a buried insulator layer, separates a base substrate from a top semiconductor layer.

With continued reference to FIG. 2, the first semiconductor layer 108, is formed on the substrate 102 using an epitaxial growth process. For instance, in the described embodiment, the first semiconductor layer 108 is formed by epitaxially growing a layer of SiGe with a germanium concentration varying from approximately 45 atomic percent to approximately 70 atomic percent. In an exemplary embodiment, the first semiconductor layer 108 can be grown to a thickness varying from approximately 4 nm to approximately 10 nm, although other thicknesses are within the contemplated scope of the invention.

The second semiconductor layer 110 is formed similarly to the first semiconductor layer 108, i.e., using an epitaxial growth process. However, the second semiconductor layer 110 is formed with a lower germanium concentration that can vary between approximately 15 atomic percent to approximately 35 atomic percent. By way of example only, the second semiconductor layer 110 may be formed having a thickness varying from approximately 10 nm to approximately 40 nm, although thicknesses greater than 40 nm and less than 10 nm may also be used.

Similar to the first and second semiconductor layers 108, 110, the third semiconductor layer 112 is formed using an epitaxial growth process. In this instance, a layer of epitaxially grown SiGe forms the third semiconductor layer 112. A germanium concentration of the third semiconductor layer 112 is similar to the germanium concentration of the first semiconductor layer 108, i.e., a germanium concentration varying from approximately 45 atomic percent to approximately 70 atomic percent. In the depicted example, a thickness of the third semiconductor layer 112 is similar to the thickness of the first semiconductor layer 108, i.e., a thickness varying from approximately 4 nm to approximately 10 nm. The higher concentration of germanium atoms in the first and third semiconductor layers 108, 112 allows the first and third semiconductor layer 108, 112 to be removed selectively to the second semiconductor layer 110 and remaining semiconductor layers of the stack, as will he described in detail below.

To continue building the stack of semiconductor layers, the fourth semiconductor layer 202 is formed by epitaxially growing a Si layer to a thickness varying from approximately 50 nm to approximately 150 nm, although other thicknesses are within the contemplated scope of the invention.

In general, the first, second, third and fourth semiconductor layers 108, 110, 112, 202 can be formed by epitaxial growth by using the substrate 102 as the seed layer. Terms such as "epitaxial growth and/or deposition" and "epitaxially formed and/or grown" refer to the growth of a semiconductor material on a deposition surface of a semiconductor material, in which the semiconductor material being grown has the same or substantially similar crystalline characteristics as the semiconductor material of the deposition surface. In an epitaxial deposition process, the chemical reactants provided by the source gases are controlled and the system parameters are set so that the depositing atoms arrive at the deposition surface of the semiconductor substrate with sufficient energy to move around on the surface and orient themselves to the crystal arrangement of the atoms of the deposition surface. Therefore, an epitaxial semiconductor material has the same or substantially similar crystalline characteristics as the deposition surface on which it is formed. For example, an epitaxial semiconductor material deposited on a {100} crystal surface will take on a {100} orientation. In some embodiments, epitaxial growth and/or deposition processes are selective to forming on a semiconductor surface, and do not deposit material on dielectric surfaces, such as silicon dioxide or silicon nitride surfaces.

Non-limiting examples of various epitaxial growth processes include rapid thermal chemical vapor deposition (RTCVD), low-energy plasma deposition (LEPD), ultra-high vacuum chemical vapor deposition (UHVCVD), atmospheric pressure chemical vapor deposition (APCVD), metalorganic chemical vapor deposition (MOCVD), low-pressure chemical vapor deposition (LPCVD), limited reaction processing CVD (LRPCVD), and molecular beam epitaxy (MBE). The temperature for an epitaxial deposition process can range from 500° C. to 900° C. Although higher temperatures typically results in faster deposition, the faster deposition may result in crystal defects and film cracking.

A number of different precursors may be used for the epitaxial growth of the first, second, third and fourth semiconductor layers 108, 110, 112, 202. In some embodiments, a gas source for the deposition of epitaxial semiconductor material includes a silicon containing gas source, a germanium containing gas source, or a combination thereof. For example, an epitaxial silicon layer may be deposited from a silicon gas source including, but not necessarily limited to, silane, disilane, trisilane, tetrasilane, hexachlorodisilane, tetrachlorosilane, dichlorosilane, trichlorosilane, and combinations thereof. An epitaxial germanium layer can be deposited from a germanium gas source including, but not necessarily limited to, germane, digermane, halogermane, dichlorogermane, trichlorogermane, tetrachlorogermane and combinations thereof. While an epitaxial silicon germanium alloy layer can be formed utilizing a combination of such gas sources. Carrier gases like hydrogen, helium and argon can be used.

With continued reference to FIG. 2, the hardmask layer 204 is formed over the fourth semiconductor layer 202 by depositing a hard mask material (e.g., silicon nitride) using, for example, chemical vapor deposition (CVD), plasma enhanced CVD (PECVD) or any suitable technique for dielectric deposition. By way of example only, the hardmask layer 204 may be formed having a thickness varying from approximately 20 nm to approximately 200 nm, although thicknesses greater than 200 nm and less than 20 nm may also be used.

Figure 3:
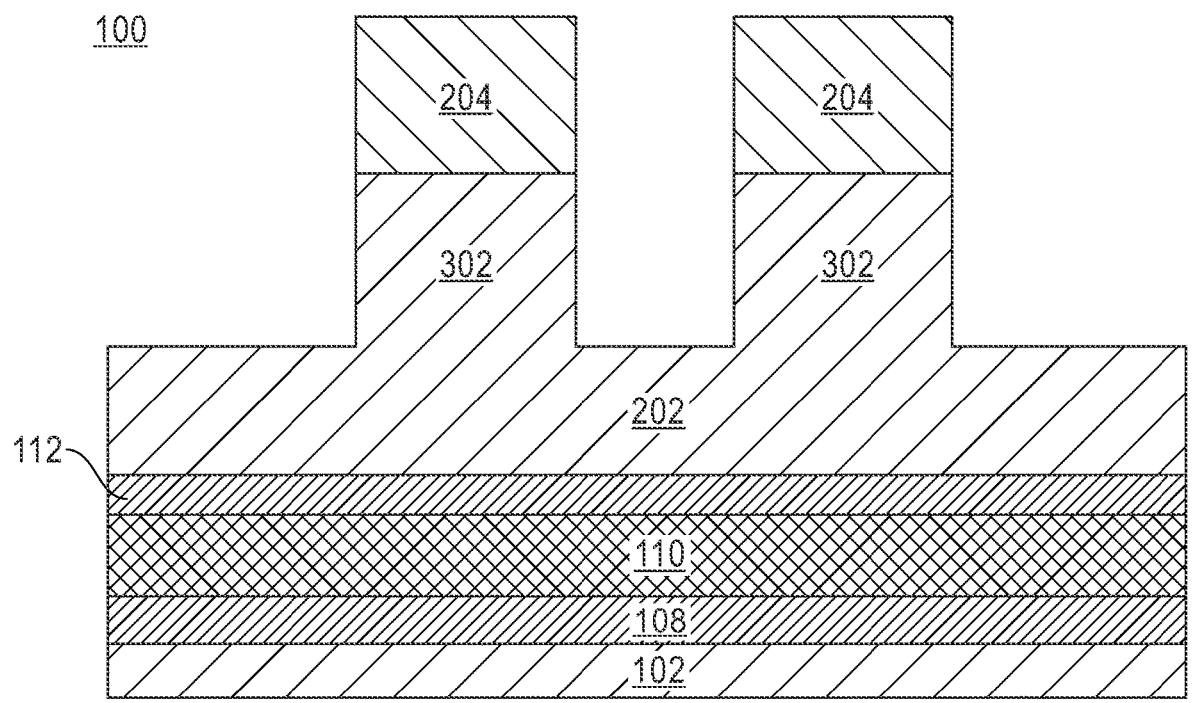
FIG. 3 is a cross-sectional view of a semiconductor structure taken along line X-X', as shown in FIG. 1, depicting patterning a channel fin, according to an embodiment of the present disclosure.

Referring now to FIG. 3, a cross-sectional view of the semiconductor structure 100 is shown after patterning a channel fin 302, according to an embodiment of the present disclosure. In this embodiment, FIG. 3 is a cross-sectional view of the semiconductor structure 100 taken along line X-X', as depicted in FIG. 1.

In this embodiment, a photolithographic patterning is conducted on the deposited hardmask layer 204 to form a plurality of individual fin hardmasks. According to an exemplary embodiment, reactive ion etching (RIE) is used to etch through the fourth semiconductor layer 202 to form the fins 302. Portions of the fourth semiconductor layer 202 remain below the channel fin 302 above a top surface of the third semiconductor layer 112.

Figure 4A:
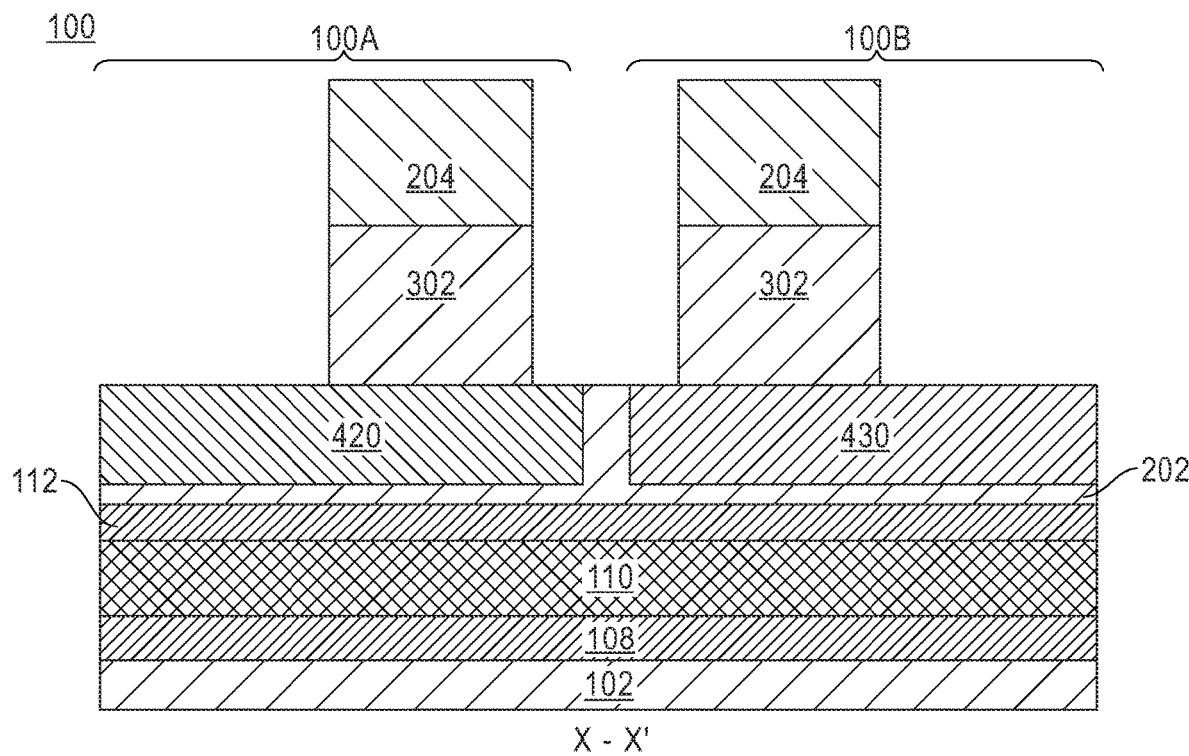
FIG. 4A is a cross-sectional view of the semiconductor structure taken along line X-X', as shown in FIG. 1, depicting forming bottom source and drain regions, according to an embodiment of the present disclosure.
Figure 4B:
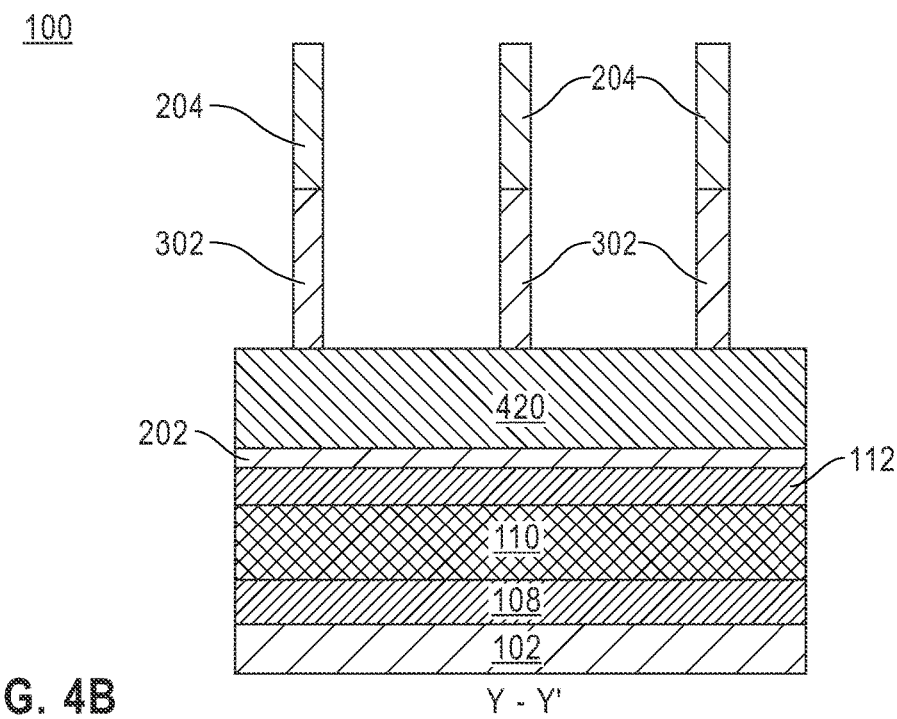
FIG. 4B is a cross-sectional view of the semiconductor structure taken along line Y-Y', as shown in FIG. 1.

Referring now to FIGS. 4A-4B, cross-sectional views of the semiconductor structure 100 are shown after forming bottom source and drain regions, according to an embodiment of the present disclosure. In this embodiment, FIG. 4A is a cross-sectional view of the semiconductor structure 100 taken along line X-X', as depicted in FIG. 1, and FIG. 4B is a cross-sectional view of the semiconductor structure 100 taken along line Y-y', as depicted in FIG. 1.

Known semiconductor fabrication operations have been used to form the semiconductor structure 100 as depicted in FIGS. 4A-4B. According to an embodiment, the semiconductor structure 100 includes a first region 100A and a second region 100B. The first region 100A includes a positive type or p-type region in which a positive channel Field. Effect Transistor (hereinafter "p-FET") can be formed. The second region 100B includes a negative type or n-type region in which a negative channel Field Effect Transistor (hereinafter "n-FET") device can be formed. For illustration purposes only, without intent of limitations, the first region 100A is a p-type region and the second region 100B is a n-type region. Those skilled in the art may know that the first region 100A and the second region 100B can have any polarity as needed to satisfy design requirements.

Each of the first region 100A and second region 100B of the semiconductor structure 100 includes a channel fin 302 extending vertically or perpendicularly to the substrate 102. A first bottom source/drain region 420 is formed on a first portion of the fourth semiconductor layer 202 located below the channel fin 302 in the first region 100A of the semiconductor structure 100. Similarly, a second bottom source/drain region 430 is formed on a second portion of the fourth semiconductor layer 202 located below the channel fin 302 in the second region 100B of the semiconductor structure 100, It should be noted that virtually all semiconductor transistors are based on the formation of junctions. Junctions are capable of both blocking current and allowing it to flow, depending on an applied bias. Junctions are typically formed by placing two semiconductor regions with opposite polarities into contact with one another. As may be known by those skilled in the art, the most common junction is the p-n junction, which consists of a contact between a p-type piece of silicon, rich in holes, and an n-type piece of silicon, rich in electrons.

In one or more embodiments, the first bottom source/drain region 420 and the second bottom source/drain region 430 can be formed after patterning the channel fin 302. The first bottom source/drain region 420 and the second bottom source/drain region 430 can be formed with the necessary doping, e.g., n-type dopants (e.g., phosphorus or arsenic) or p-type dopants (e.g., boron or gallium), depending on the type of transistor. The first bottom source/drain region 420 and the second bottom source/drain region 430 can be formed by any suitable doping technique, including but not limited to, ion implantation, gas phase doping, plasma doping, plasma immersion ion implantation, cluster doping, infusion doping, liquid phase doping, solid phase doping, in-situ epitaxy growth, or any suitable combination of those techniques.

In an exemplary embodiment, the dopant concentration in the first bottom source drain region 420 (i.e., p-FET or first region 100A) can range from approximately $1 \times 10^{19}$ cm$^{-3}$ to approximately $2 \times 10^{21}$ cm$^{-3}$, or preferably between $2 \times 10^{19}$ cm$^{-1}$ and $1 \times 10^{21}$ cm$^{-3}$, while the dopant concentration in the second bottom source/drain region 430 (i.e., n-FET or second region 100B) can range from approximately $1 \times 10^{19}$ cm$^{-3}$ to approximately $2 \times 10^{21}$ cm$^{-3}$, or preferably between $2 \times 10^{20}$ cm$^{-3}$ and $1 \times 10^{21}$ cm$^{-3}$.

As can be observed in the figure, portions of the fourth semiconductor layer 202 remain between the first bottom source/drain region 420 and the second bottom source/drain region 430, and between the third semiconductor layer 112 and the first and second bottom source/drain regions 420, 430.

Figure 5A:
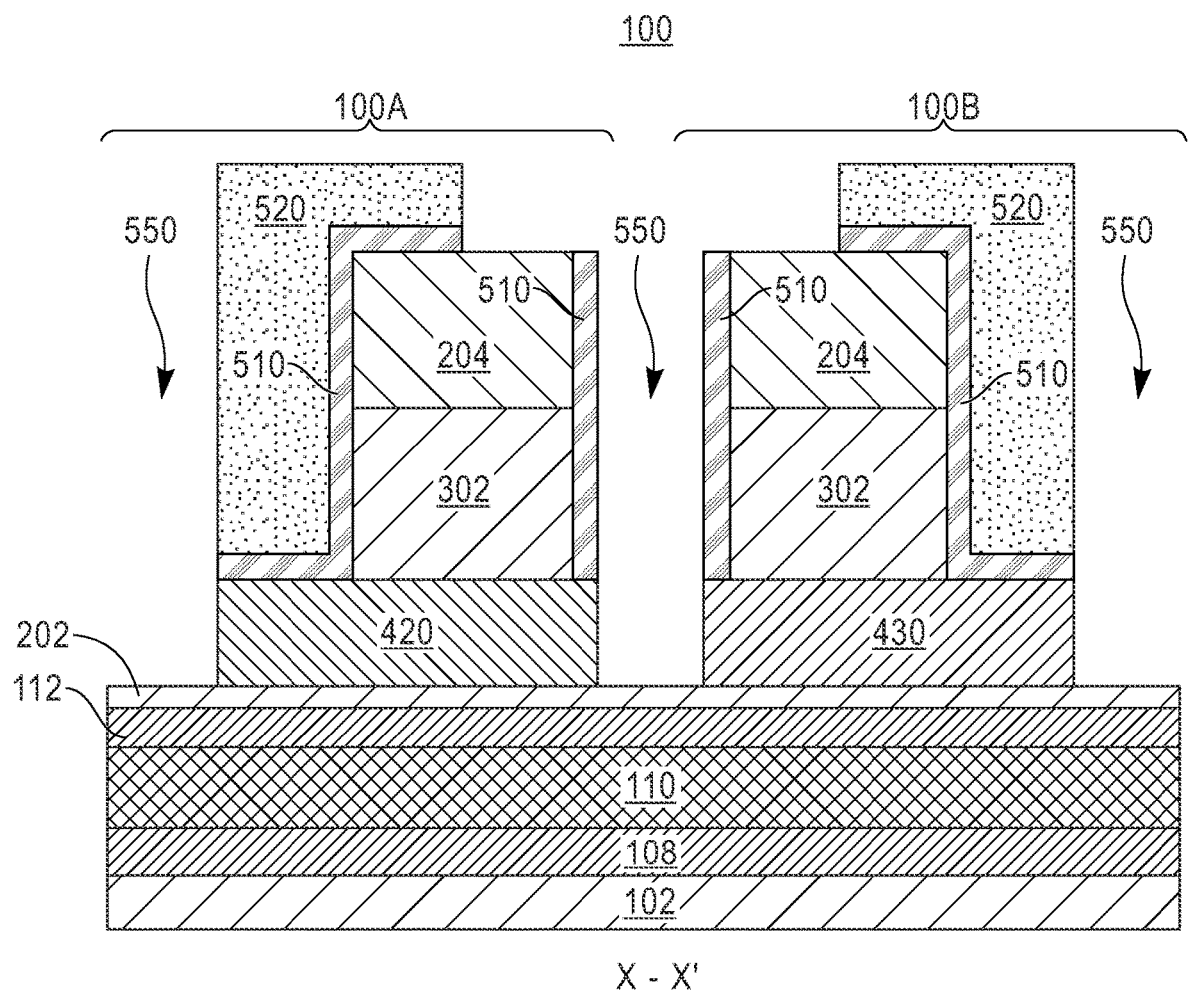
FIG. 5A is a cross-sectional view of the semiconductor structure taken along line X-X', as shown in FIG. 1, depicting forming a spacer and a first soft mask, according to an embodiment of the present disclosure.
Figure 5B:
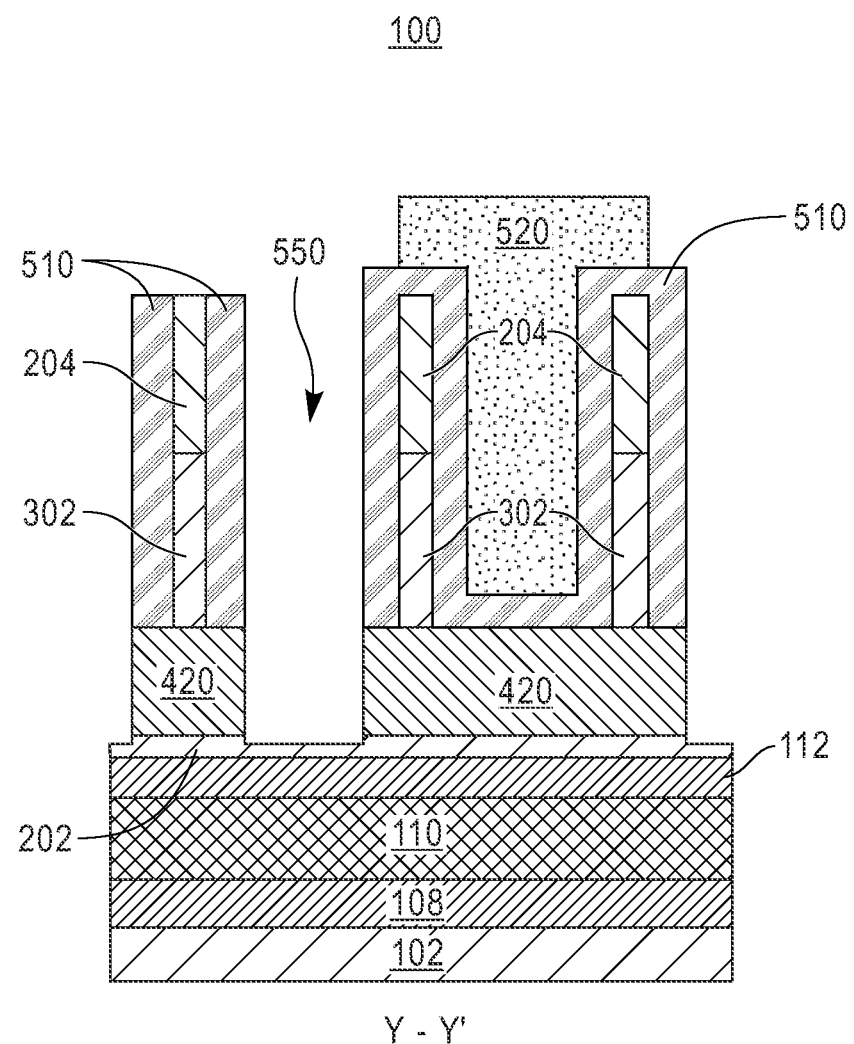
FIG. 5B is a cross-sectional view of the semiconductor structure taken along line Y-Y', as shown in FIG. 1.

Referring now to FIGS. 5A-5B, cross-sectional views of the semiconductor structure 100 are shown after forming a spacer 510 and a first soft mask 520, according to an embodiment of the present disclosure. In this embodiment, FIG. 5A is a cross-sectional view of the semiconductor structure 100 taken along line X-X', as depicted in FIG. 1, and FIG. 5B is a cross-sectional view of the semiconductor structure 100 taken along line Y-Y', as depicted in FIG. 1.

In this embodiment, a spacer material has been conformity deposited on the semiconductor structure 100. Specifically, the spacer material is deposited along opposite sidewalls of the channel fin 302 and hardmask layer 204, above a portion of the first and second bottom source/drain regions 420, 430 not covered by the channel fin 3032, and partially above a top surface of the hardmask layer 204 to form a spacer 510. The spacer 510 can be formed using a spacer pull down formation process. The spacer 510 can also be formed using a sidewall image transfer (SIT) spacer formation process, which includes spacer material deposition followed by directional RIE of the deposited spacer material.

Non-limiting examples of various spacer materials for forming the spacer 510 may include conventional low-k materials such as $SiO_2$, SiOC, SiOCN, or SiBCN. Typically, a thickness of the spacer 510 may vary from approximately 5 nm to approximately 20 nm, and ranges therebetween.

With continued reference to FIGS. 5A-5B, a first soft mask 520 is formed above the spacer 510 to protect underlying structures during a subsequent etch process used to form openings 550.

According to an embodiment, the first soft mask 520 can be an organic planarization layer (OPL) that is formed on the semiconductor structure 100 to cover a space between regions of the same polarity. As may be observed, the first soft mask 520 is patterned in a way such that an opening 550 remain between the first region 100A and the second region 100B. Thus, a space between regions of different polarity is not covered by the first soft mask 520. Forming the first soft mask 520, allows etching the spacer 510 and the first and second bottom source/drain regions 420, 430, as will be described in detail below.

The first soft mask 520 can be made of any organic planarizing material that is capable of effectively preventing damage of underlying layers during subsequent etching processes. The first soft mask 520 can include, but is not necessarily limited to, an organic polymer including C, H, and N. According to an embodiment, the OPL material can be free of silicon (Si). According to another embodiment, the OPL material can be free of Si and fluorine (F), As defined herein, a material is free of an atomic element when the level of the atomic element in the material is at or below a trace level detectable with analytic methods available in the art. Non-limiting examples of the OPL material forming the first soft mask 520 can include JSR HM8006, JSR HM8014, AZ UM10M2, Shin Etsu ODL 102, or other similar commercially available materials. The first soft mask 520 may be deposited by, for example, spin coating followed by a planarization process, such as CMP.

With continued reference to FIGS. 5A-5B, a lithography process followed by an etching process is conducted on the semiconductor structure 100 for etching the first soft mask 520 and forming the openings 550, as shown in the figure. In some embodiments, etching the first soft mask 520 can be conducted by, for example, an OPL RIE including a trace point detection.

As depicted in the figure, the openings 550 exposed an uppermost surface of the fourth semiconductor layer 202. Specifically, as shown in FIG. 5A, at least one opening 550 is formed between the first bottom source/drain region 420 and the second bottom source/drain region 430. It should be noted that the spacer 510 is removed from an inner portion of the top surface of the hardmask layer 204. Stated differently, the inner portion of the top surface of the hardmask layer 204 remains opened or not covered by the spacer 510 and first soft mask 520.

Figure 6A:
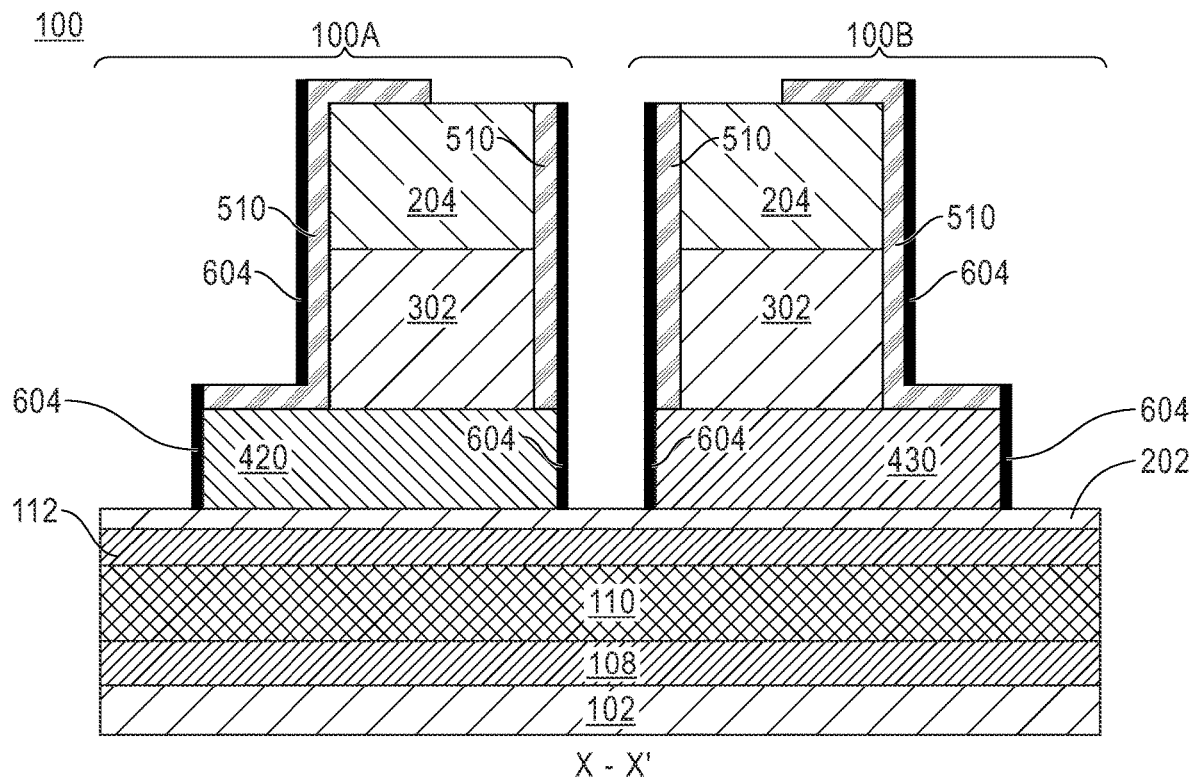
FIG. 6A is a cross-sectional view of the semiconductor structure taken along line X-X', as shown in FIG. 1, depicting removing the first soft mast and forming a protecting liner, according to an embodiment of the present disclosure.
Figure 6B:
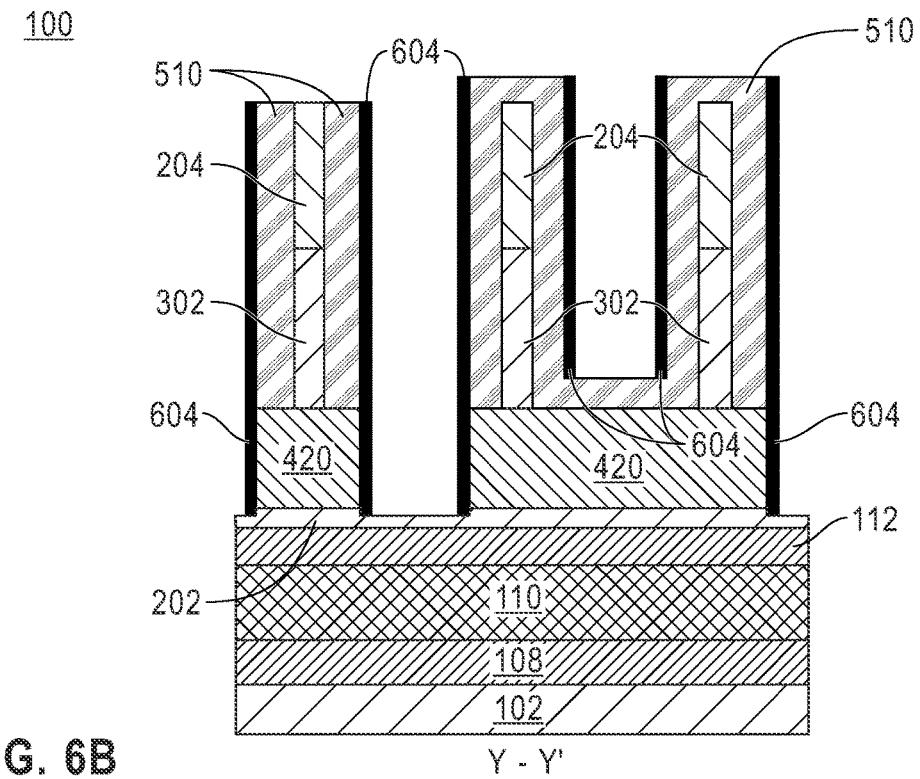
FIG. 6B is a cross-sectional view of the semiconductor structure taken along line Y-Y', as shown in FIG. 1.

Referring now to FIGS. 6A-6B, cross-sectional views of the semiconductor structure 100 are shown after removing the first soft mask 520 and forming a protecting liner 604, according to an embodiment of the present disclosure, in this embodiment, FIG. 6A is a cross-sectional view of the semiconductor structure 100 taken along line X-X', as depicted in FIG. 1, and FIG. 6B is a cross-sectional view of the semiconductor structure 100 taken along line Y-Y', as depicted in FIG. 1.

Exemplary techniques suitable for removing the first soft mask 520 (FIGS. 6A-6B) from the semiconductor structure 100 may include, but are not limited to, oxygen plasma, nitrogen plasma, hydrogen plasma or other carbon strip or ashing process, which causes minimal or no damage to the underlying layers.

After removing the first soft mask 520 (FIGS. 6A-6B), the protective liner 604 is formed along exposed vertical portions (i.e., opposite sidewalk) of the first and second bottom source/drain regions 420, 430, and along vertical portions (i.e., opposite sidewalls) of the spacer 510. The protective liner 604 is formed by a conformal liner deposition followed by anisotropic etch to remove the protective liner 604 from horizontal surfaces. Any suitable liner material can be used to form the protective liner 604. In one or more embodiments, the protective liner 604 may have a thickness varying from approximately 1 nm to approximately 5 nm, and ranges therebetween.

Figure 7A:
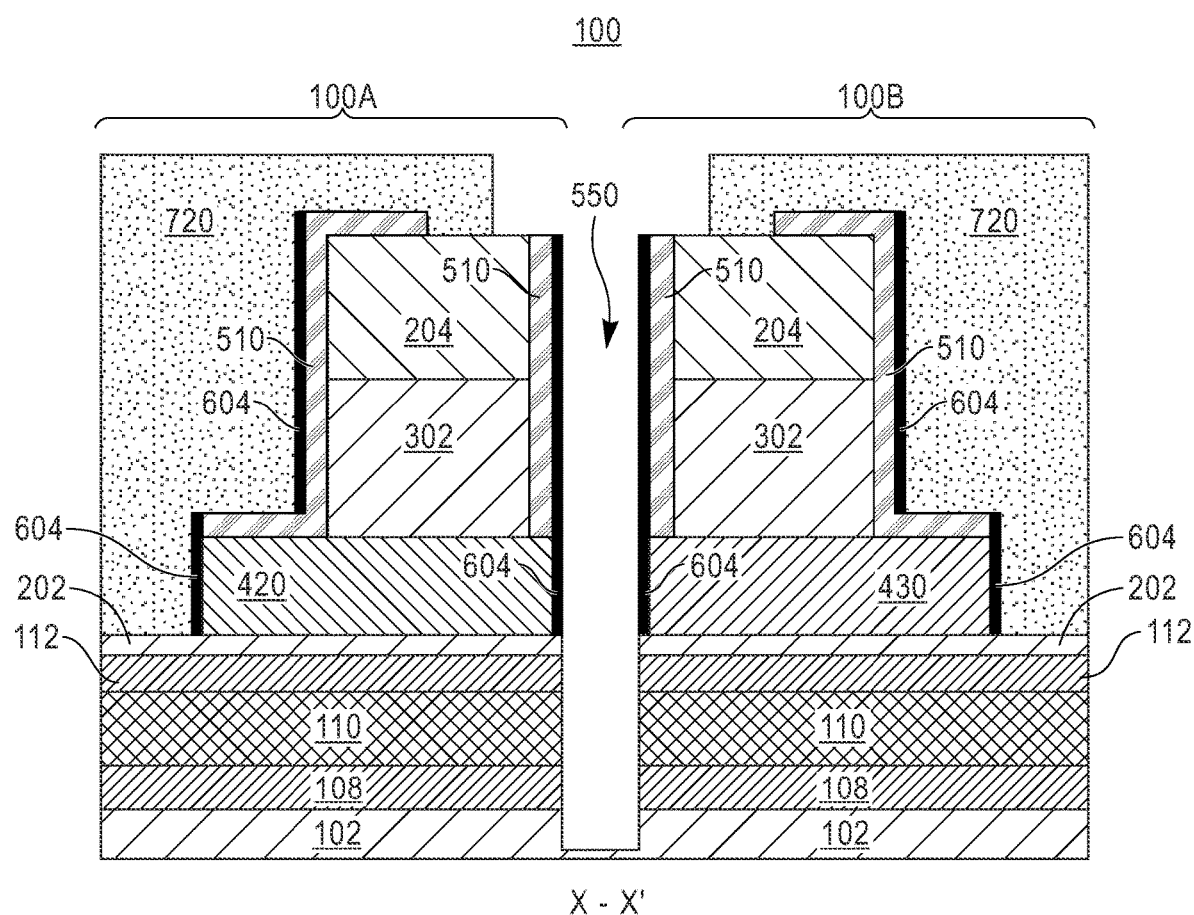
FIG. 7A is a cross-sectional view of the semiconductor structure taken along line X-X', as shown in FIG. 1, depicting forming a second soft mast, according to an embodiment of the present disclosure.
Figure 7B:
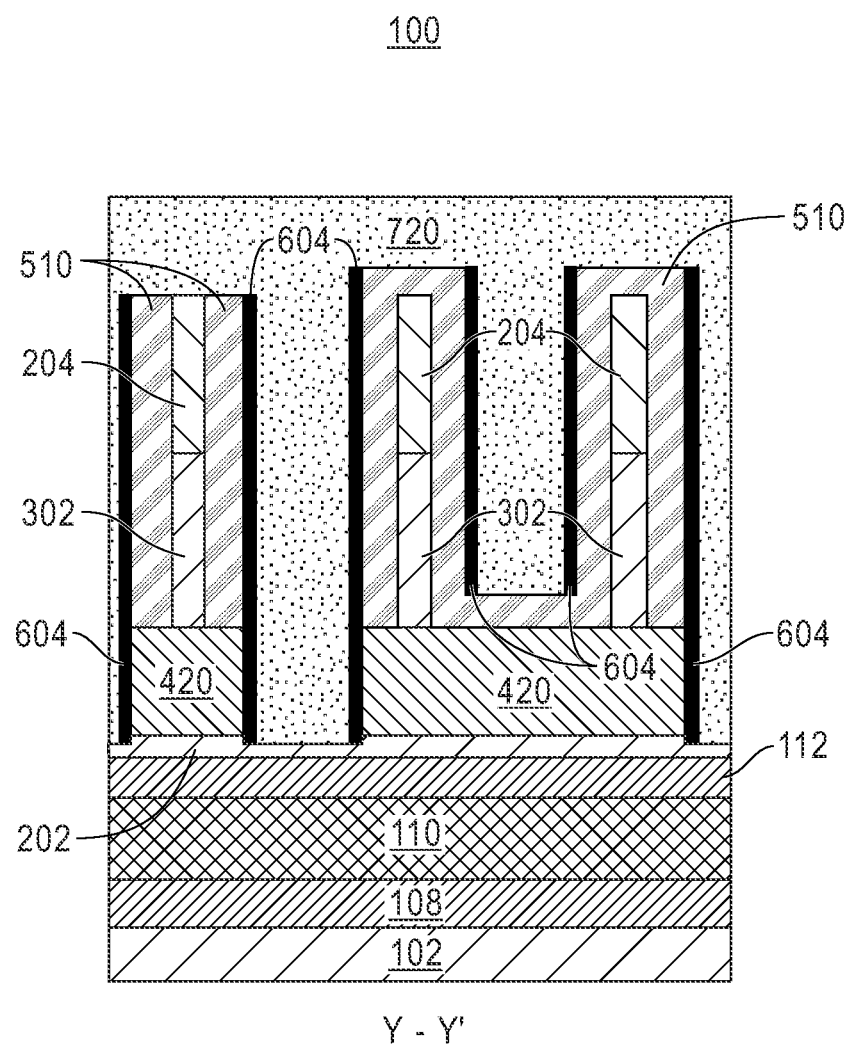
FIG. 7B is a cross-sectional view of the semiconductor structure taken along line Y-Y', as shown in FIG. 1.

Referring now to FIGS. 7A-7B, cross-sectional views of the semiconductor structure 100 are shown after forming a second soft mask 720, according to an embodiment of the present disclosure. In this embodiment, FIG. 7A is a cross-sectional view of the semiconductor structure 100 taken along line as depicted in FIG. 1, and FIG. 7B is a cross-sectional view of the semiconductor structure 100 taken along line Y-Y', as depicted in FIG. 1.

The second soft mask 720 is composed of similar materials and formed in similar ways as the first soft mask 520. In the depicted embodiment, the second soft mask layer 720 allows conducting an etching process to deepen the opening 550 located between the first region 100A and the second region 100B (i.e., n-p boundary). The etching is conducted until substantially removing or recessing a portion of the substrate 102, as shown in FIG. 7A. Stated differently, after forming the second soft mask layer 720, the opening 550 between the first region 100A and the second region 100B is further extended by etching the remaining portion of the fourth semiconductor layer 202 and etching the first, second, and third semiconductor layers 108, 110, 112 until recessing a portion of the substrate 102, as depicted in the FIG. 7A.

As described above, a lithography process followed by an etching process is first conducted on the semiconductor structure 100 for patterning the second soft mask 720 and etching the remaining portion of the fourth semiconductor layer 202, the first, second, and third semiconductor layers 108, 110, 112, and the substrate 102.

Figure 8A:
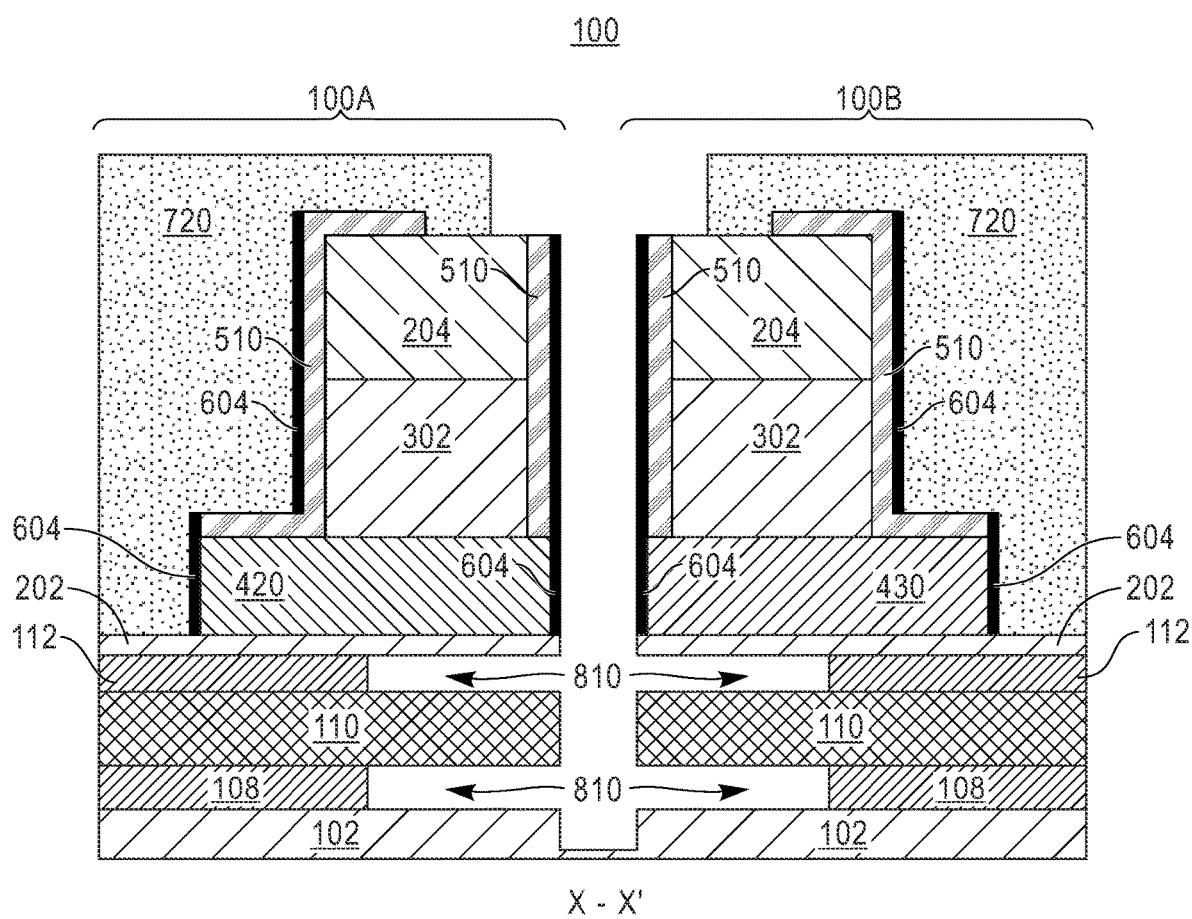
FIG. 8A is a cross-sectional view of the semiconductor structure taken along line X-X', as shown in FIG. 1, depicting recessing inner portions of first and third semiconductor layers, according to an embodiment of the present disclosure.
Figure 8B:
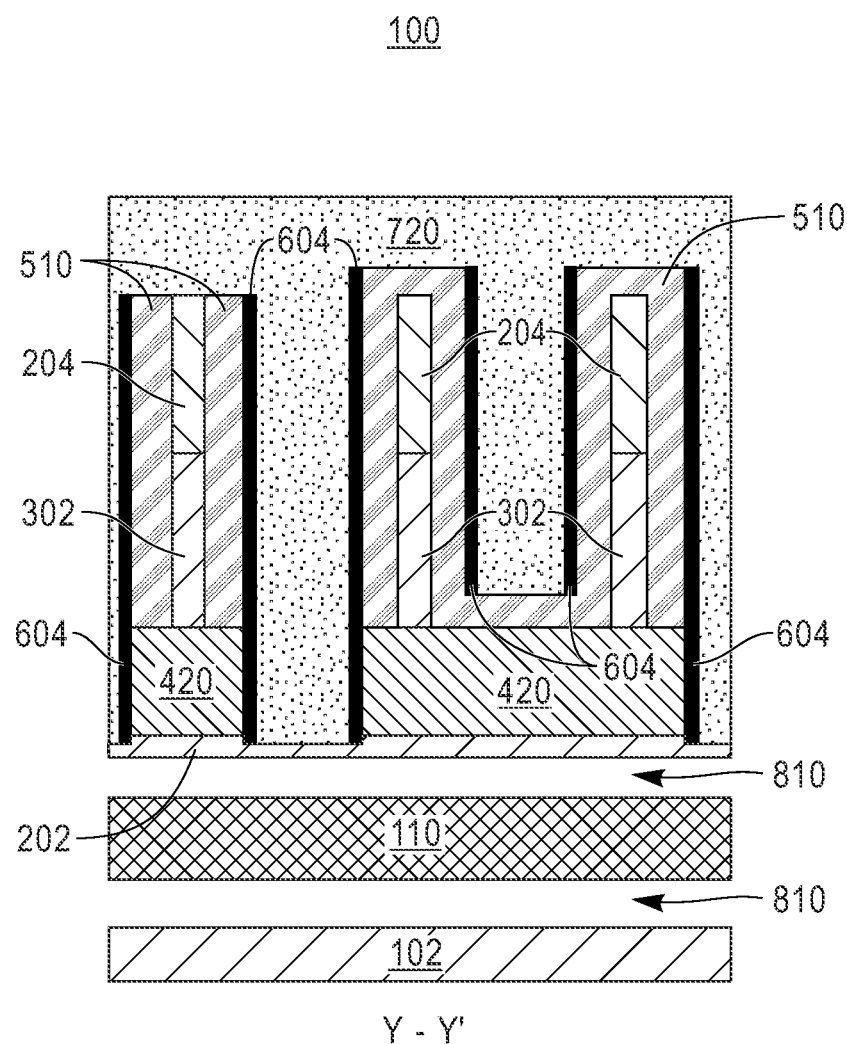
FIG. 8B is a cross-sectional view of the semiconductor structure taken along line Y-Y', as shown in FIG. 1.

Referring now to FIGS. 8A-8B, cross-sectional views of the semiconductor structure 100 are shown after recessing inner portions of the first and third semiconductor layers 108, 112, according to an embodiment of the present disclosure. In this embodiment, FIG. 8A is a cross-sectional view of the semiconductor structure 100 taken along line X-X', as depicted in FIG. 1, and FIG. 8B is a cross-sectional view of the semiconductor structure 100 taken along line Y-Y', as depicted in FIG. 1.

In this embodiment, inner portions of each of the first semiconductor layers 108 and third semiconductor layers 112 are selectively recessed using, for example, a selective etch process such as a hydrogen chloride (HCL) gas etch. Preferably, the selected etch process for recessing the first semiconductor layers 108 and third semiconductor layers 112 is capable of etching silicon germanium without attacking silicon. Etching the inner portions of the first semiconductor layers 108 and third semiconductor layers 112 creates first indented cavities 810.

Figure 9A:
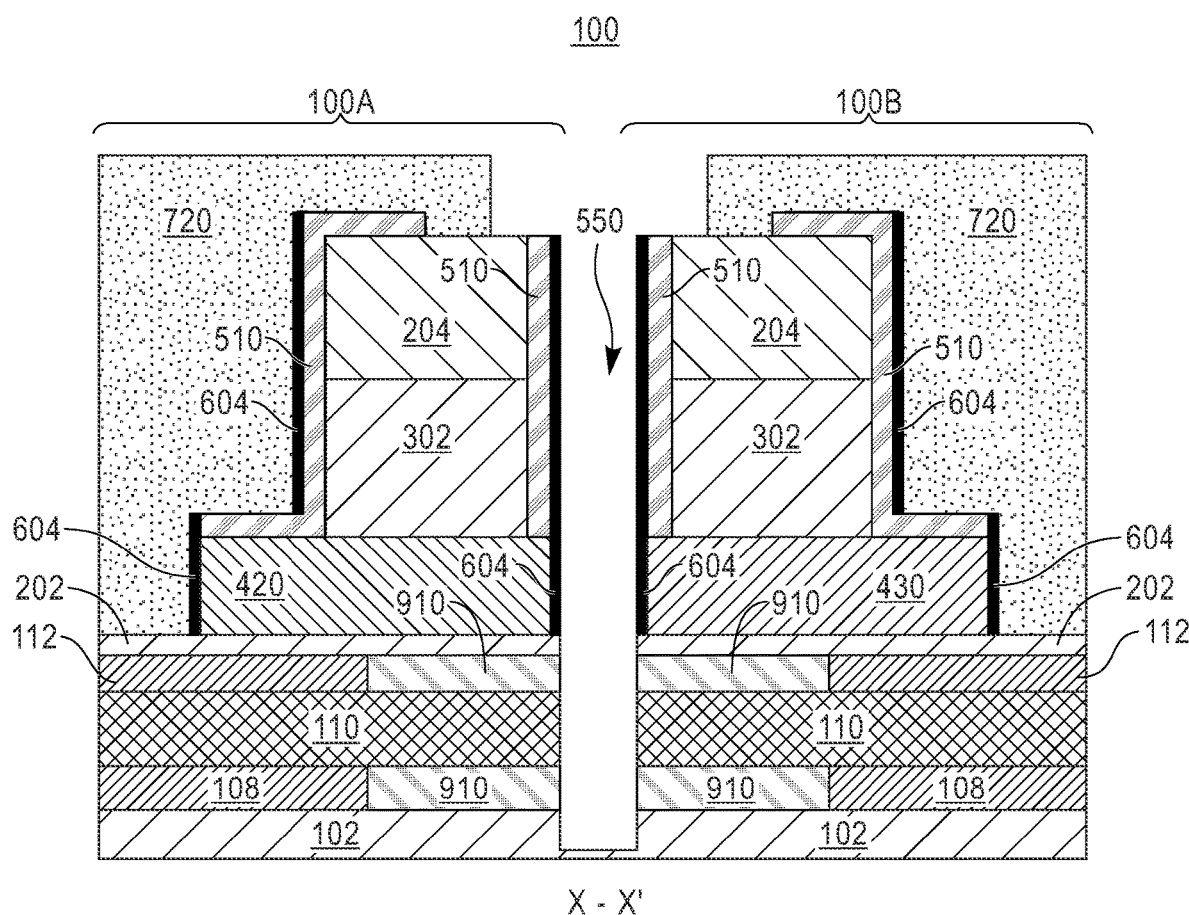
FIG. 9A is a cross-sectional view of the semiconductor structure taken along line X-X', as shown in FIG. 1, depicting forming first inner spacers, according to an embodiment of the present disclosure.
Figure 9B:
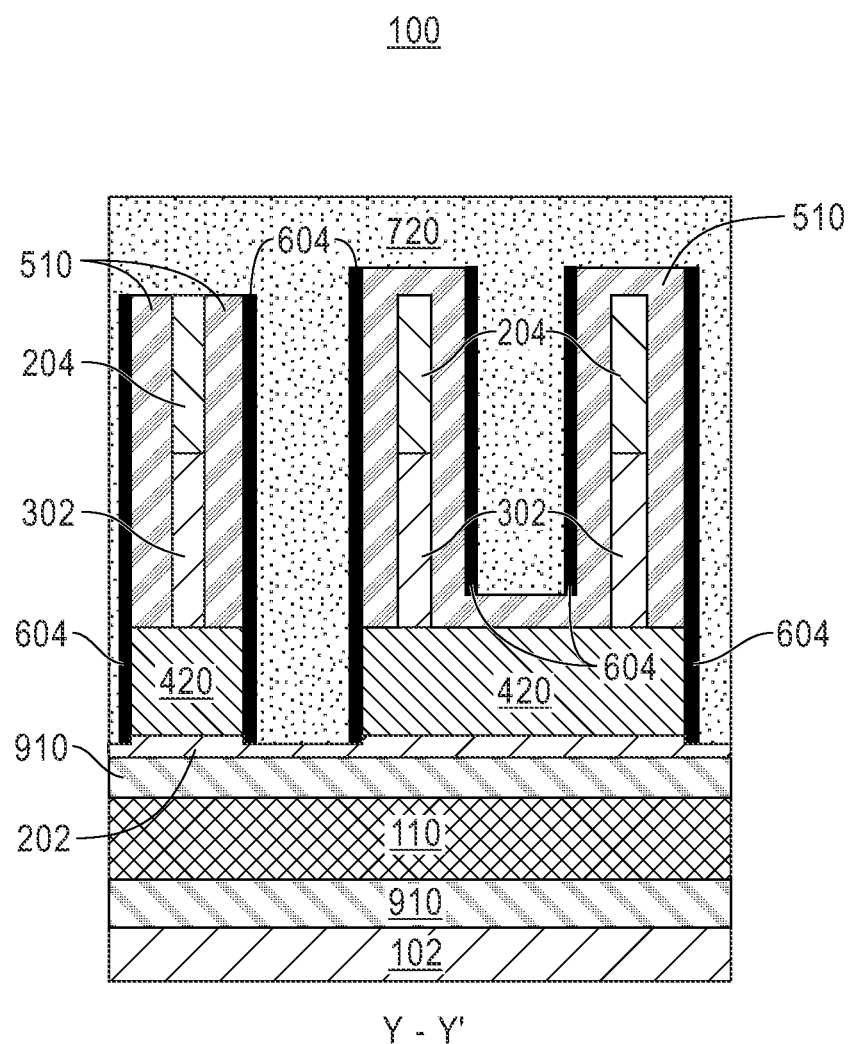
FIG. 9B is a cross-sectional view of the semiconductor structure taken along line Y-Y', as shown in FIG. 1.

Referring now to FIGS. 9A-9B, cross-sectional views of the semiconductor structure 100 are shown after forming first inner spacers 910, according to an embodiment of the present disclosure. In this embodiment, FIG. 9A is a cross-sectional view of the semiconductor structure 100 taken along line X-X', as depicted in FIG. 1, and FIG. 9B is a cross-sectional view of the semiconductor structure 100 taken along line Y-Y', as depicted in FIG. 1.

The first inner spacers 910 may be formed within the indented cavities 810 (FIGS. 8A-8B) created after etching the inner portions of the first semiconductor layers 108 and third semiconductor layers 112. The first inner spacers 910 can be formed, for example, by conformal deposition of an inner spacer dielectric material that pinches off the first indented cavities 810 (FIGS. 8A-8B). The first inner spacers 910 may include any suitable dielectric material, such as silicon dioxide, silicon nitride, SiOC, SiOCN, SiBCN, and may include a single layer or multiple layers of dielectric materials. An isotropic etch can then be conducted to remove excess inner spacer material from other regions of the semiconductor structure 100.

As depicted in FIG. 9A, inner sidewalk of the first inner spacers 910 are vertically aligned with the protective liner 604.

Figure 10A:
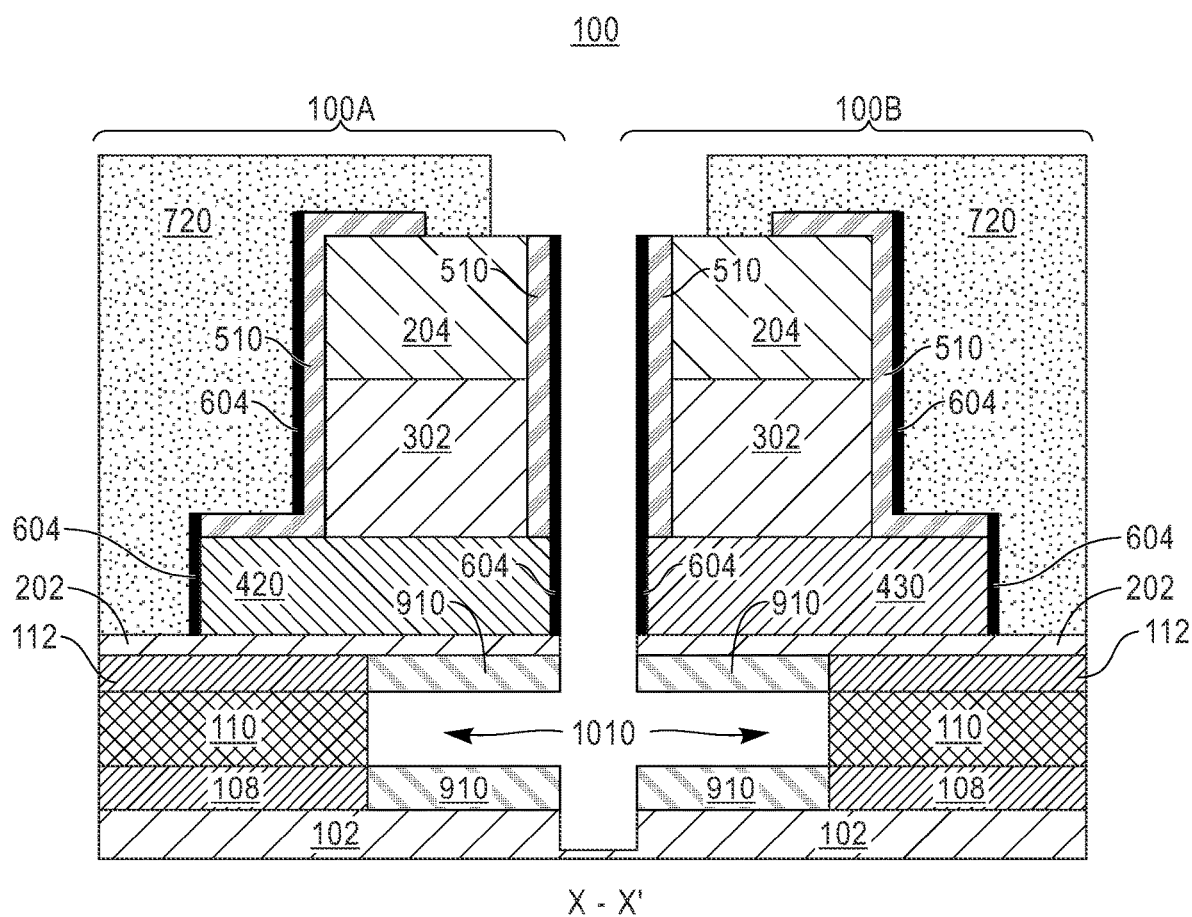
FIG. 10A is a cross-sectional view of the semiconductor structure taken along line X-X', as shown in FIG. 1, depicting recessing second semiconductor layers, according to an embodiment of the present disclosure.
Figure 10B:
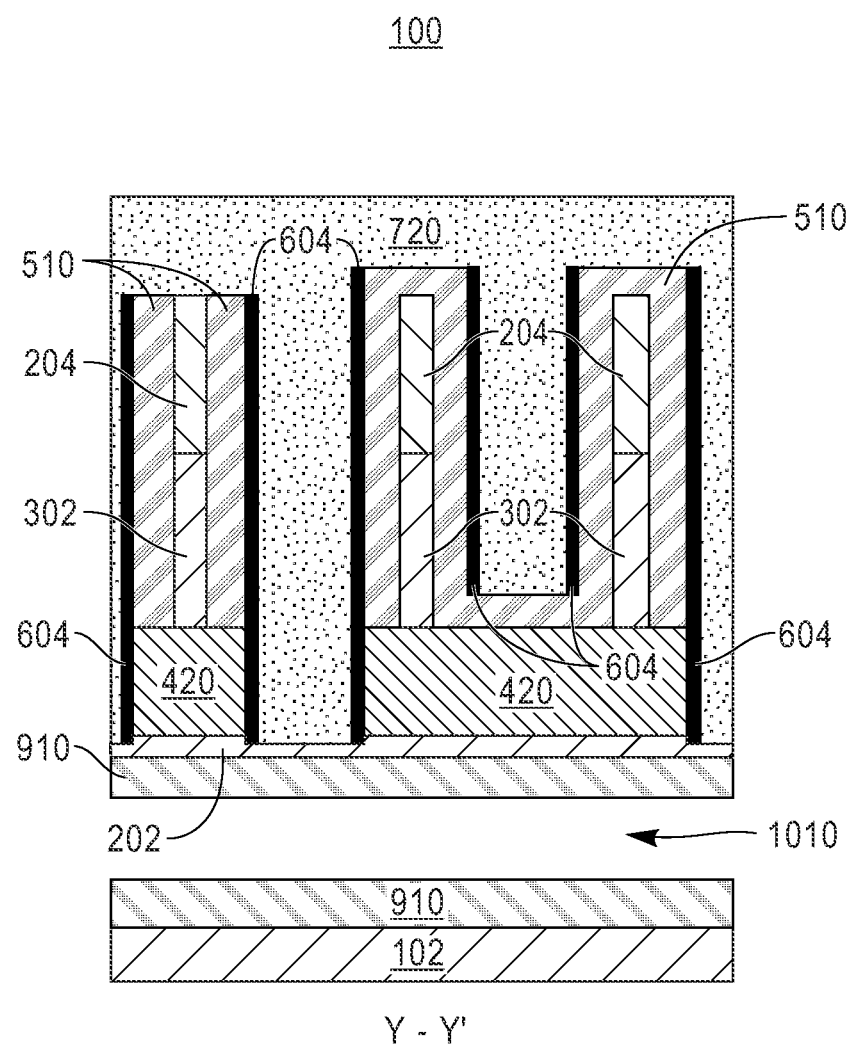
FIG. 10B is a cross-sectional view of the semiconductor structure taken along line Y-Y', as shown in FIG. 1.

Referring now to FIGS. 10A-10B, cross-sectional views of the semiconductor structure 100 are shown after recessing the second semiconductor layers 110, according to an embodiment of the present disclosure. In this embodiment, FIG. 10A is a cross-sectional view of the semiconductor structure 100 taken along line X-X', as depicted in FIG. 1, and FIG. 10B is a cross-sectional view of the semiconductor structure 100 taken along line Y-Y', as depicted in FIG. 1.

Similar to the first semiconductor layer 108 and third semiconductor layer 112, inner portions of the second semiconductor layer 110 are selectively recessed using, for example, a selective etch process such as a hydrogen chloride (HCL) gas etch. Preferably, the selected etch process for recessing the second semiconductor layer 110 is capable of etching silicon germanium without attacking silicon. Etching the inner portions of the second semiconductor layer 110 creates second indented cavities 1010.

After recessing the inner portions of the second semiconductor layer 110, the second soft mask 720 can be removed. Exemplary techniques suitable for removing the second soft mask 720 from the semiconductor structure 100 may include, but are not limited to, oxygen plasma, nitrogen plasma, hydrogen plasma or other carbon strip or ashing process, which causes minimal or no damage to the underlying layers.

Figure 11A:
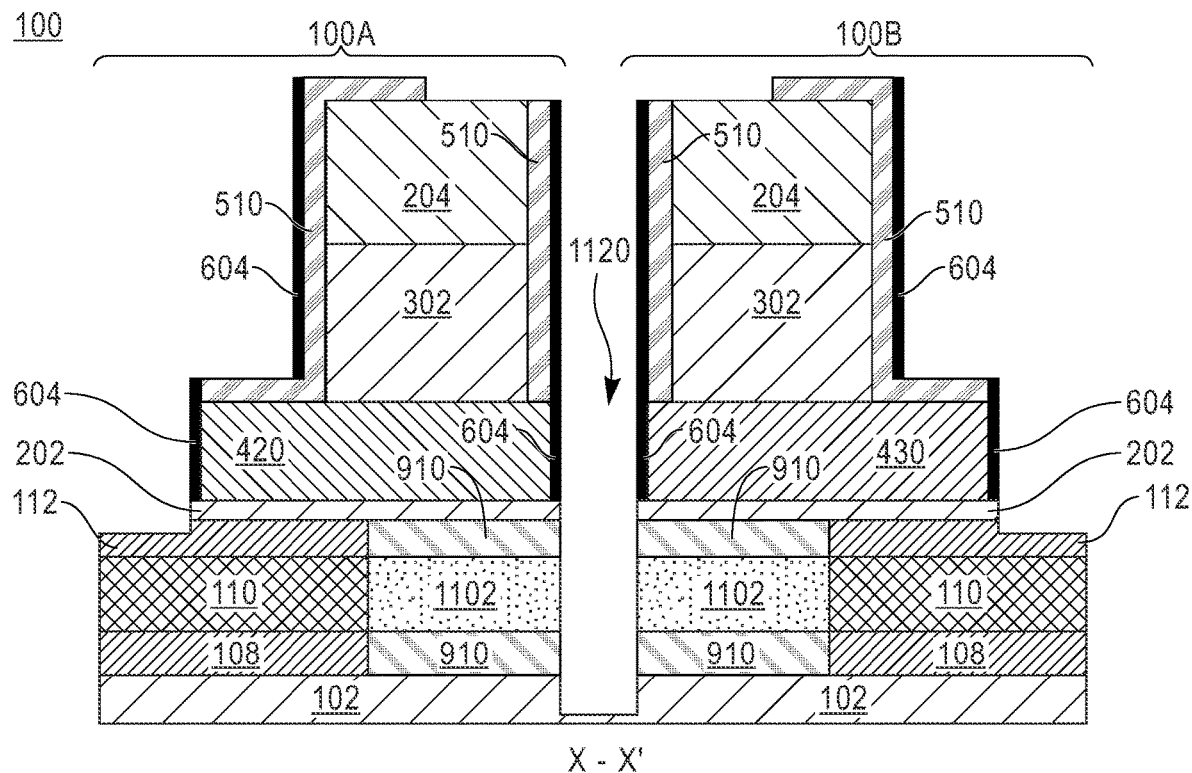
FIG. 11A is a cross-sectional view of the semiconductor structure taken along line X-X', as shown in FIG. 1, depicting forming a first metal layer, according to an embodiment of the present disclosure.
Figure 11B:
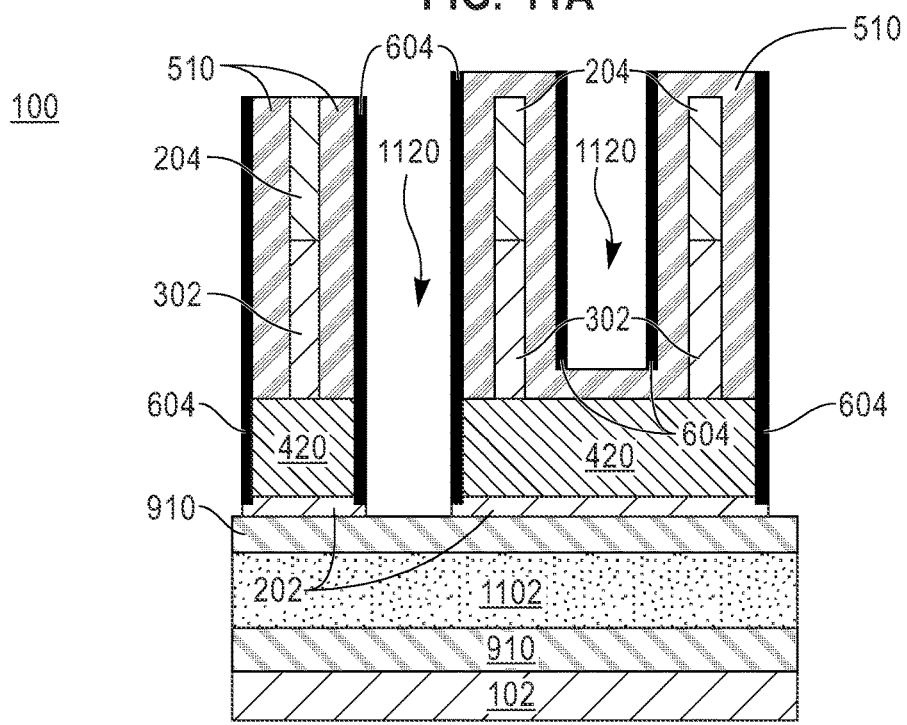
FIG. 11B is a cross-sectional view of the semiconductor structure taken along line Y-Y', as shown in FIG. 1.

Referring now to FIGS. 11A-11B, cross-sectional views of the semiconductor structure 100 are shown after forming a first metal layer 1102, according to an embodiment of the present disclosure. In this embodiment, FIG. 11A is a cross-sectional view of the semiconductor structure 100 taken along line X-X', as depicted in FIG. 1, and FIG. 11B is a cross-sectional view of the semiconductor structure 100 taken along line Y-Y', as depicted m FIG. 1.

The first metal layer 1102 may be formed within the second indented cavities 1010 (FIGS. 10A-10B) after etching the inner portions of the second semiconductor layer 110. The first metal layer 1102 can be formed, for example, by blanket deposition of a low-resistance conductive material that pinches off the second indented cavities 1010 (FIGS. 10A-10B). Non-limiting examples of conductive materials for forming the first metal layer 1102 includes ruthenium (Ru), tungsten (W), cobalt (Co), and the like. An isotropic etch can then be conducted to remove excess conductive material from other regions of the semiconductor structure 100. As can be observed in the figures, portions of the fourth semiconductor layer 202 above remaining portions of the third semiconductor layer 112 (shown in FIG. 10A) and portions of the fourth semiconductor layer 202 above the first inner spacers 910 (shown in FIG. 10B) can also be removed during the etching process.

It should be noted that preferably the conductive material forming the first metal layer 1102 has good selective with respect to the spacer 510 (e.g., oxide).

After removing the second soft mask 720, openings 1120 remain in the semiconductor structure 100. Particularly, at least one opening 1120 is located between the first regions 100A and the second region 100B (p-n boundary), and at least another opening 1120 is located between elements of the exemplary p-FET region depicted in FIG. 11B.

Figure 12A:
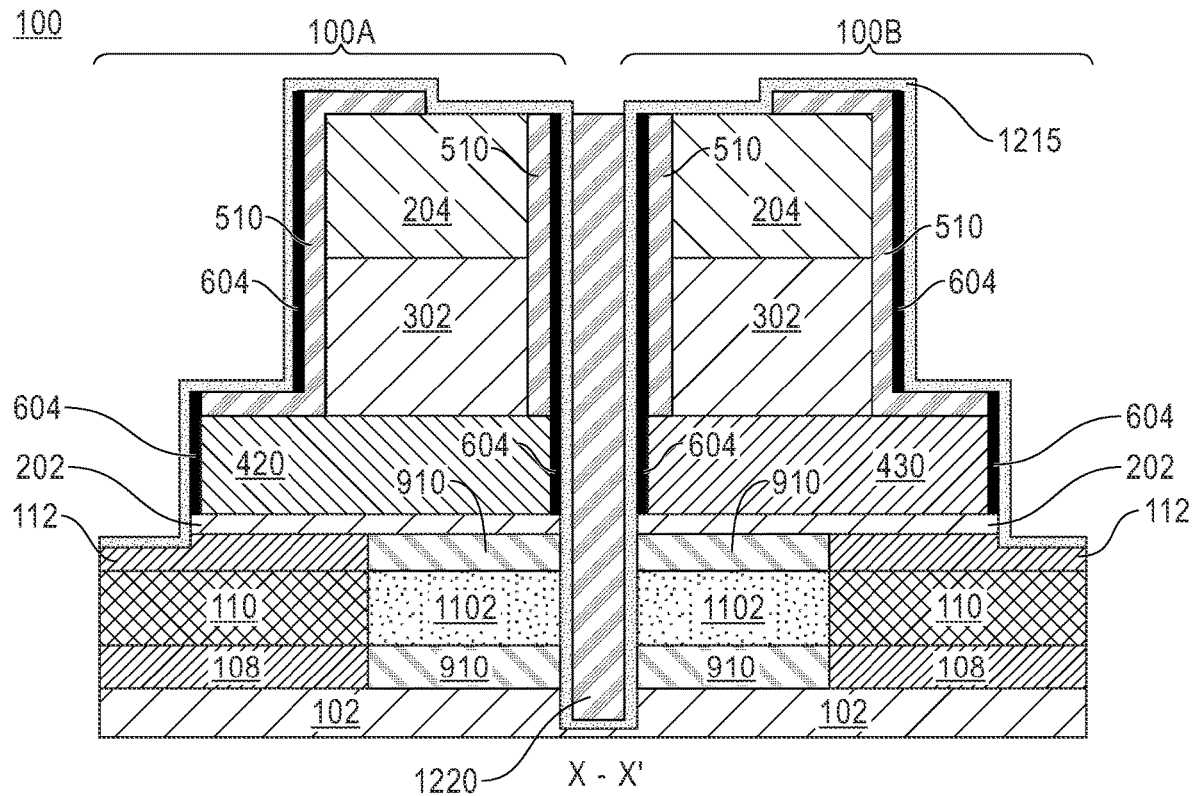
FIG. 12A is a cross-sectional view of the semiconductor structure taken along line X-X', as shown in FIG. 1, depicting forming a nitride liner and a dielectric fill layer, according to an embodiment of the present disclosure.
Figure 12B:
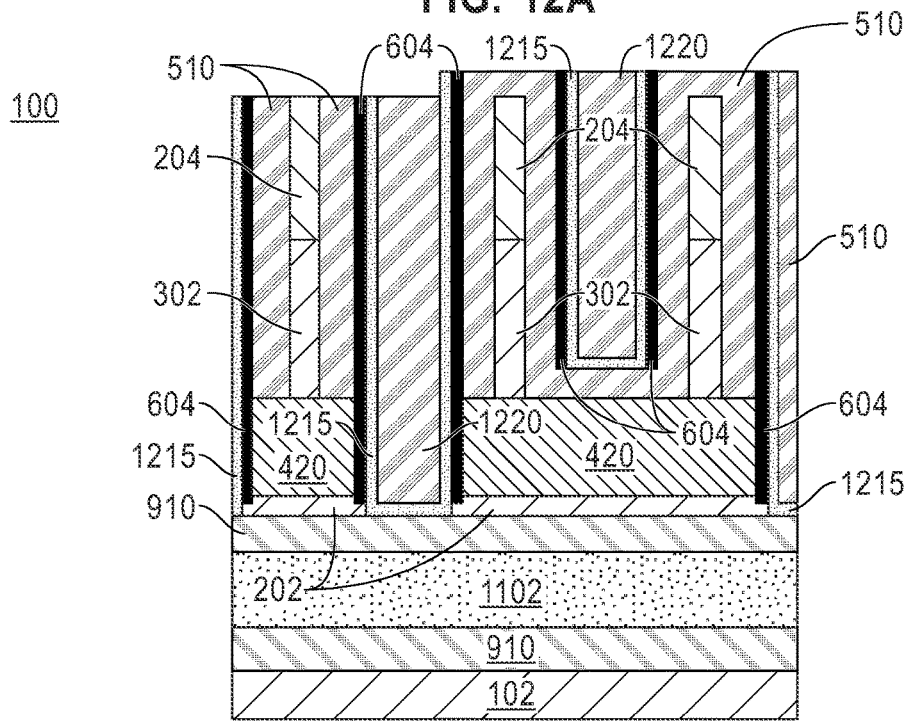
FIG. 12B is a cross-sectional view of the semiconductor structure taken along line Y-Y', as shown in FIG. 1.

Deferring now to FIGS. 12A-12B, cross-sectional views of the semiconductor structure 100 are shown after forming a (thin) nitride liner 1215 and a dielectric fill layer 1220, according to an embodiment of the present disclosure. In this embodiment, FIG. 12A is a cross-sectional view of the semiconductor structure 100 taken along line X-X', as depicted in FIG. 1, and FIG. 12B is a cross-sectional view of the semiconductor structure 100 taken along line Y-Y', as depicted in FIG. 1.

In an exemplary embodiment, the nitride liner 1215 can be formed by chemical vapor deposition (CVD) of a silicon nitride (SiN) material. A thickness of the nitride liner 1215 may vary from approximately 3 nm to approximately 6 nm, and ranges therebetween. As depicted in the figures, the nitride liner 1215 is conformally deposited on the semiconductor structure 100.

Subsequently, the dielectric till layer 1220 is deposited on the semiconductor structure 100 using any suitable deposition method (e.g., CVD). In an embodiment, the dielectric fill layer 1220 is made of silicon dioxide ($SiO_2$). As can be observed in the figures, the dielectric till layer 1220 substantially fills the openings 1120 (FIGS. 11A-11B), After depositing the dielectric fill layer 1220, an isotropic etch is conducted to remove excess portions of the dielectric fill layer 1220 located above areas of the semiconductor structure 100 outside the openings 1120 (FIGS. 11A-11B).

Figure 13A:
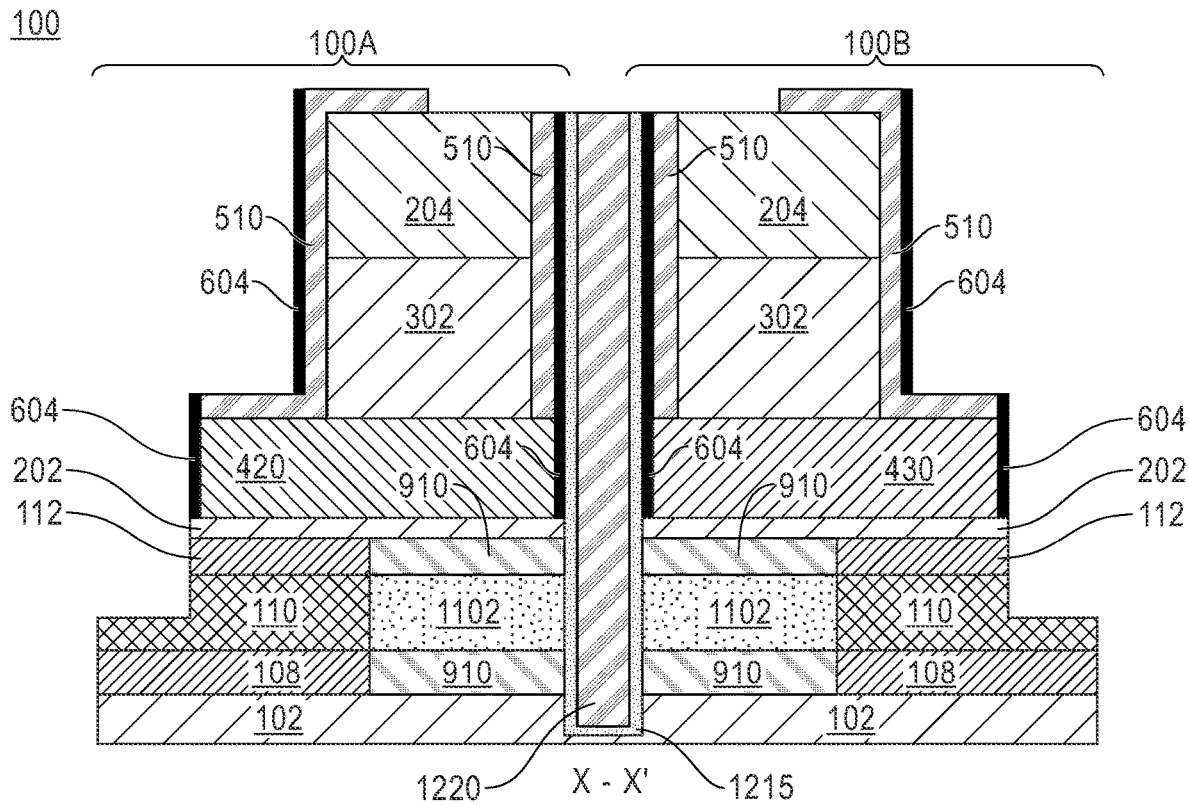
FIG. 13A is a cross-sectional view of the semiconductor structure taken along line X-X', as shown in FIG. 1, depicting removing exposed portions of the nitride liner, according to an embodiment of the present disclosure.
Figure 13B:
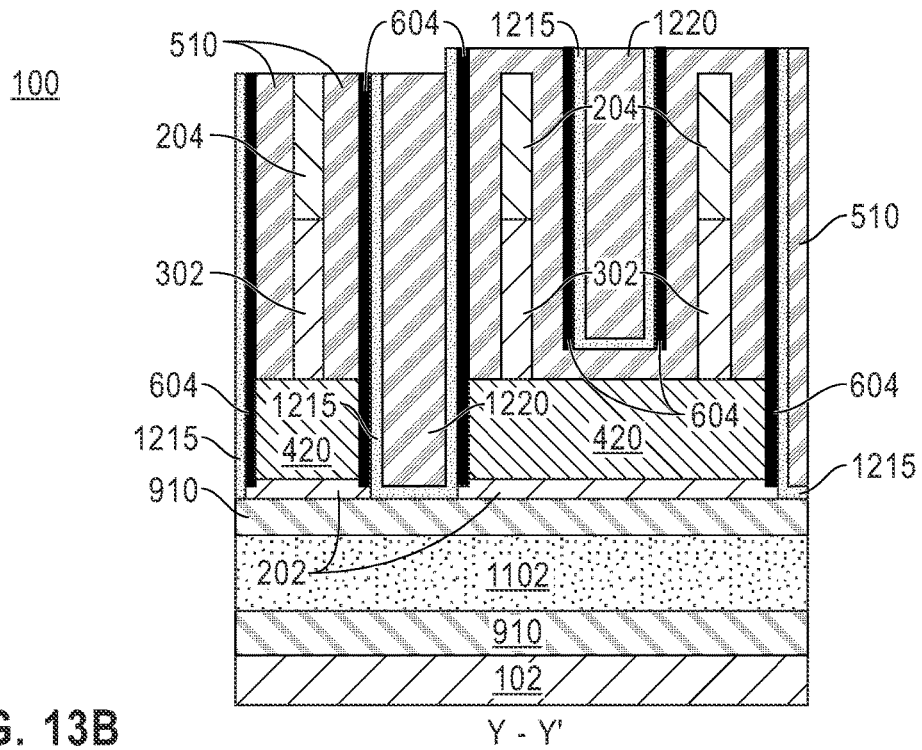
FIG. 13B is a cross-sectional view of the semiconductor structure taken along line Y-Y', as shown in FIG. 1.

Referring now to FIGS. 13A-13B, cross-sectional views of the semiconductor structure 100 are shown after removing exposed portions of the nitride liner 1215, according to an embodiment of the present disclosure. In this embodiment, FIG. 13A is a cross-sectional view of the semiconductor structure 100 taken along line X-X', as depicted in FIG. 1, and FIG. 13B is a cross-sectional view of the semiconductor structure 100 taken along line Y-Y', as depicted in FIG. 1. Any suitable etching technique such as reactive-ion etching (RIE) can be used to removed exposed portions of the nitride liner 1215. Thus, the nitride liner 1215 remain only around the dielectric fill layer 1220 In one or more embodiments, the nitride liner 1215 and the dielectric fill layer 1220 form an isolation region for electrically separating the first region 100A and the second region 100B.

Figure 14A:
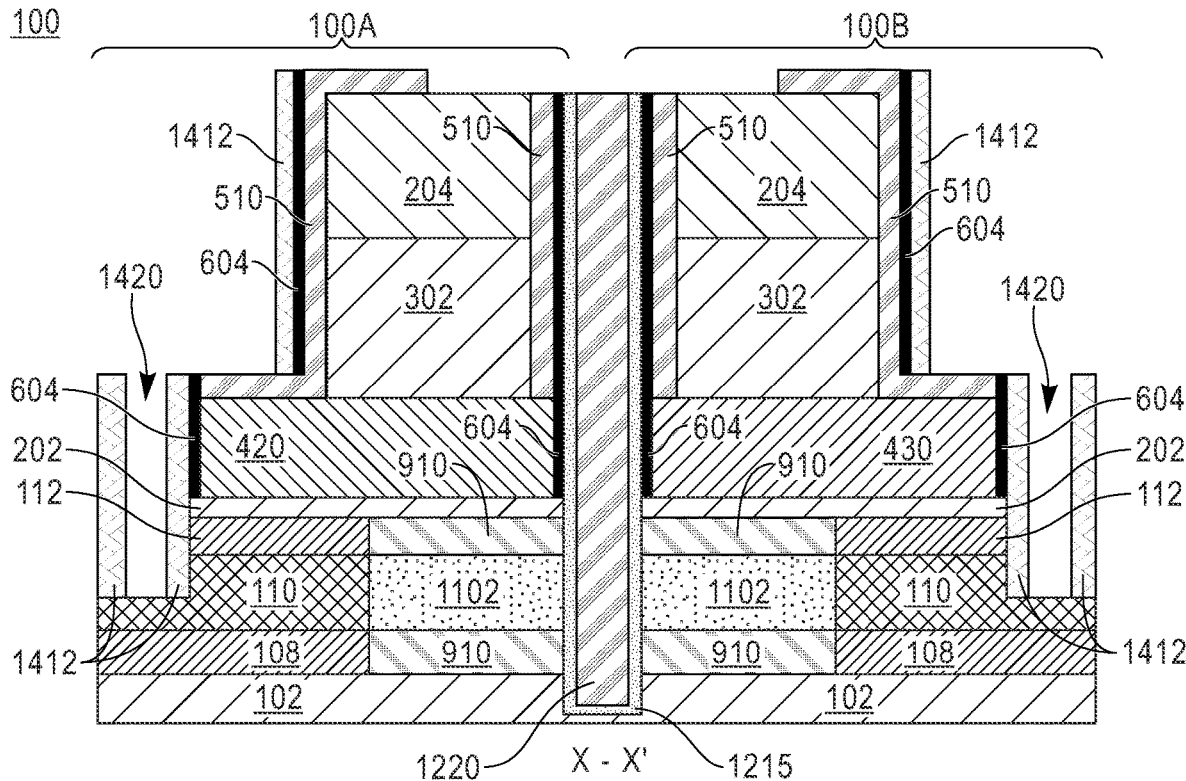
FIG. 14A is a cross-sectional view of the semiconductor structure taken along line X-X', as shown in FIG. 1, depicting forming a sacrificial spacer, according to an embodiment of the present disclosure.
Figure 14B:
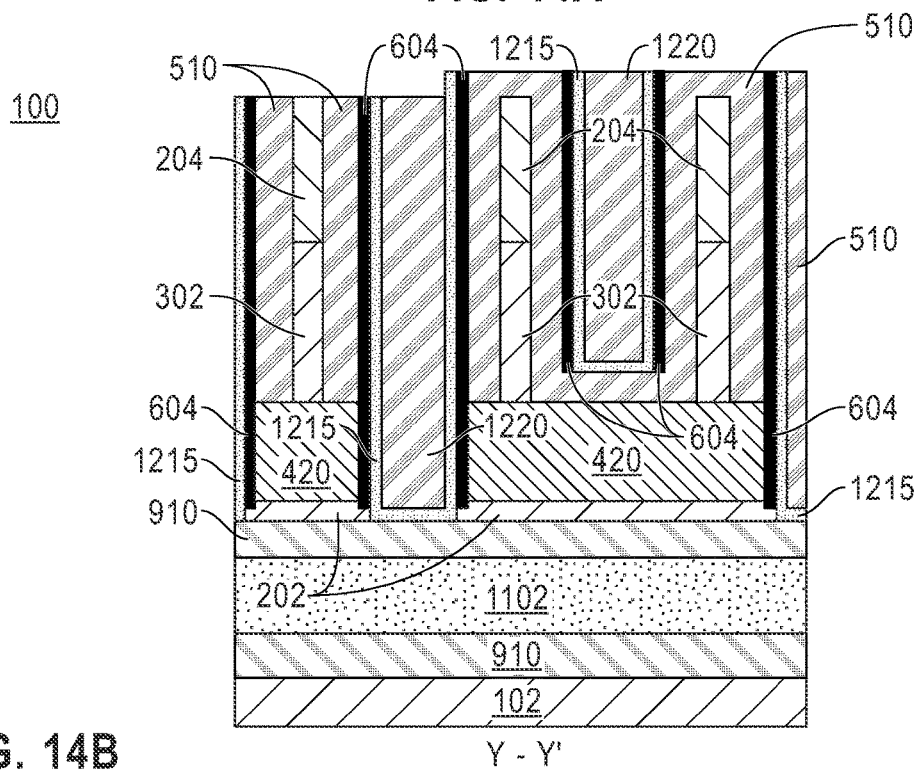
FIG. 14B is a cross-sectional view of the semiconductor structure taken along line Y-Y', as shown in FIG. 1.

Referring now to FIGS. 14A-14B, cross-sectional views of the semiconductor structure 100 are shown after forming a sacrificial spacer 1412, according to an embodiment of the present disclosure. In this embodiment, FIG. 14A is a cross-sectional view of the semiconductor structure 100 taken along line X-X', as depicted in FIG. 1, and FIG. 14B is a cross-sectional view of the semiconductor structure 100 taken along line Y-Y', as depicted in FIG. 1.

The sacrificial spacer 1412 is composed of a layer of, for example, titanium oxide (TiOx) formed using standard deposition and etching techniques. A (horizontal) thickness of the sacrificial spacer 1412 can vary between approximately 3 nm to approximately 6 nm. A (first) portion of the sacrificial spacer 1412 is formed along exposed sidewalk of the protecting liner 604 and along exposed sidewalls of the fourth semiconductor layer 202, the second semiconductor layer 110, and the third semiconductor layer 112. Another (second) portion of the sacrificial spacer 1412 is parallel to the portion of the sacrificial spacer 1412 located along sidewalls of the fourth, third, and second semiconductor layers 202, 112, and 110 and along the protective liner 604 covering the first and second bottom source/drain regions 420, 430.

As depicted in FIG. 14A, an opening 1420 remains between the two parallel portions of the sacrificial spacer 1412. The parallel portions of the sacrificial spacer 1412 serve as a template for etching the second semiconductor layer 110, the first semiconductor layer 108 and a top portion of the substrate 102, as will be described in detail below.

Figure 15A:
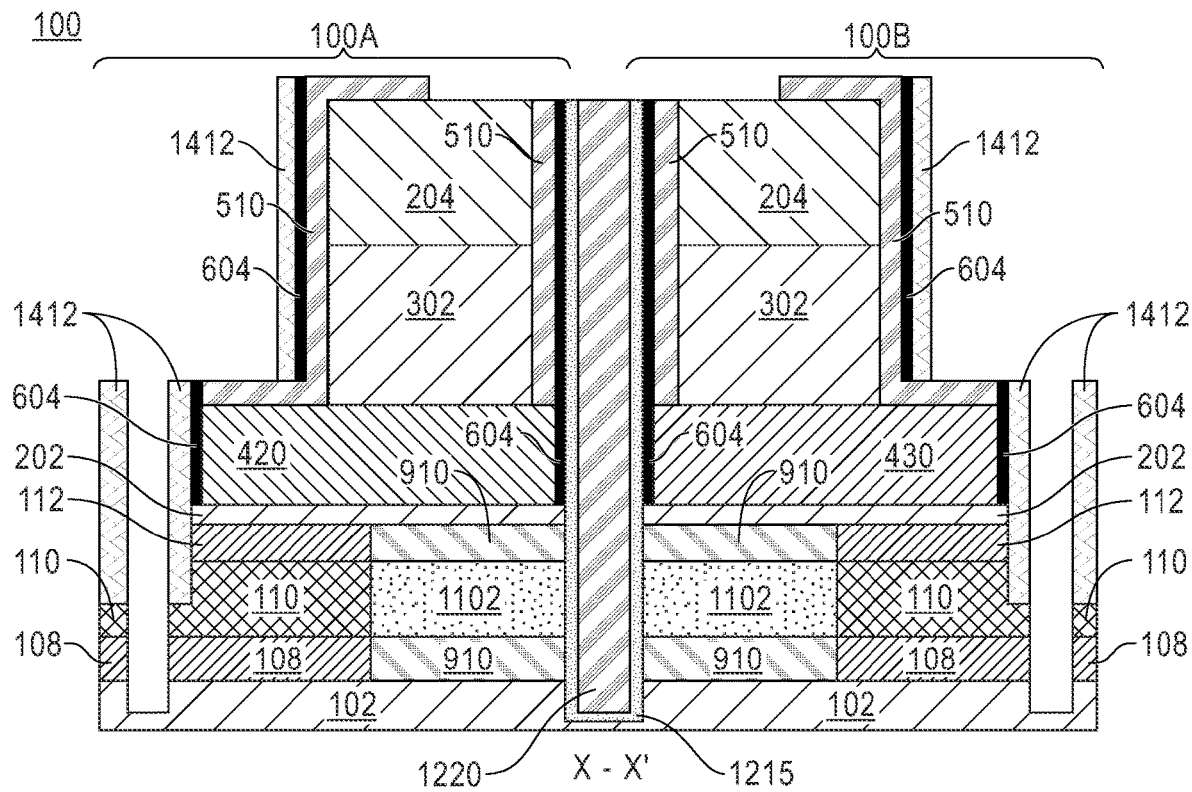
FIG. 15A is a cross-sectional view of the semiconductor structure taken along line X-X', as shown in FIG. 1, depicting etching second semiconductor layer, first semiconductor layer and a top portion of a substrate, according to an embodiment of the present disclosure.
Figure 15B:
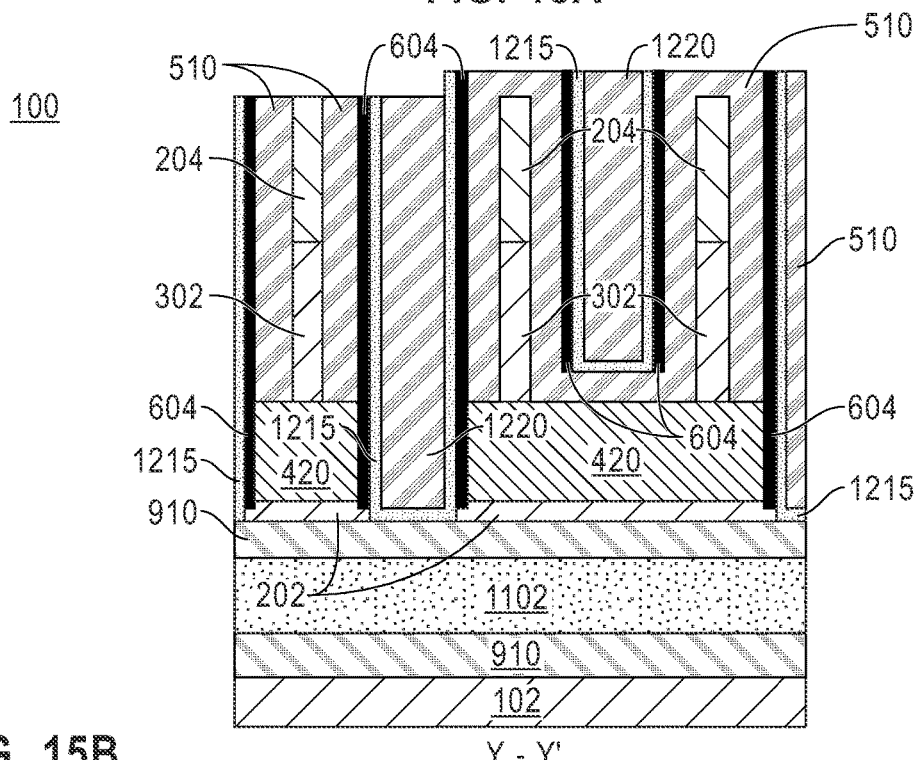
FIG. 15B is a cross-sectional view of the semiconductor structure taken along line Y-Y', as shown in FIG. 1.

Referring now to FIGS. 15A-15B, cross-sectional views of the semiconductor structure 100 are shown after etching the second semiconductor layer 110, the first semiconductor layer 108 and a top portion of the substrate 102, according to an embodiment of the present disclosure. In this embodiment, FIG. 15A is a cross-sectional view of the semiconductor structure 100 taken along line X-X', as depicted in FIG. 1, and FIG. 15B is a cross-sectional view of the semiconductor structure 100 taken along line Y-Y', as depicted in FIG. 1.

As mentioned above, parallel portions of the sacrificial spacer 1412 may function as a template for etching the underlying second semiconductor layer 110, first semiconductor layer 108 and a top portion of the substrate 102. Stated differently, in this embodiment, the opening 1420 (FIGS. 14A-14B) is extended until a top portion of the substrate 102 using, for example, RIE.

Figure 16A:
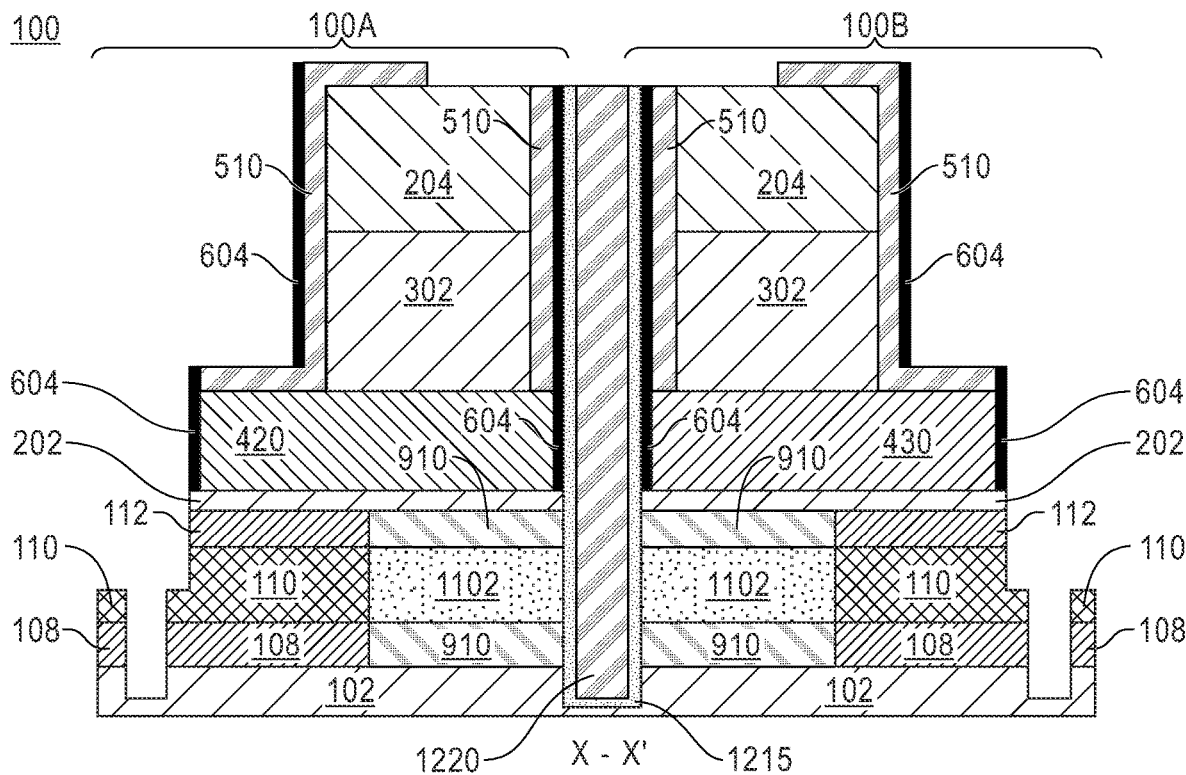
FIG. 16A is a cross-sectional view of the semiconductor structure taken along line X-X', as shown in FIG. 1, depicting removing the sacrificial spacer, first semiconductor layer and a top portion of a substrate, according to an embodiment of the present disclosure.
Figure 16B:
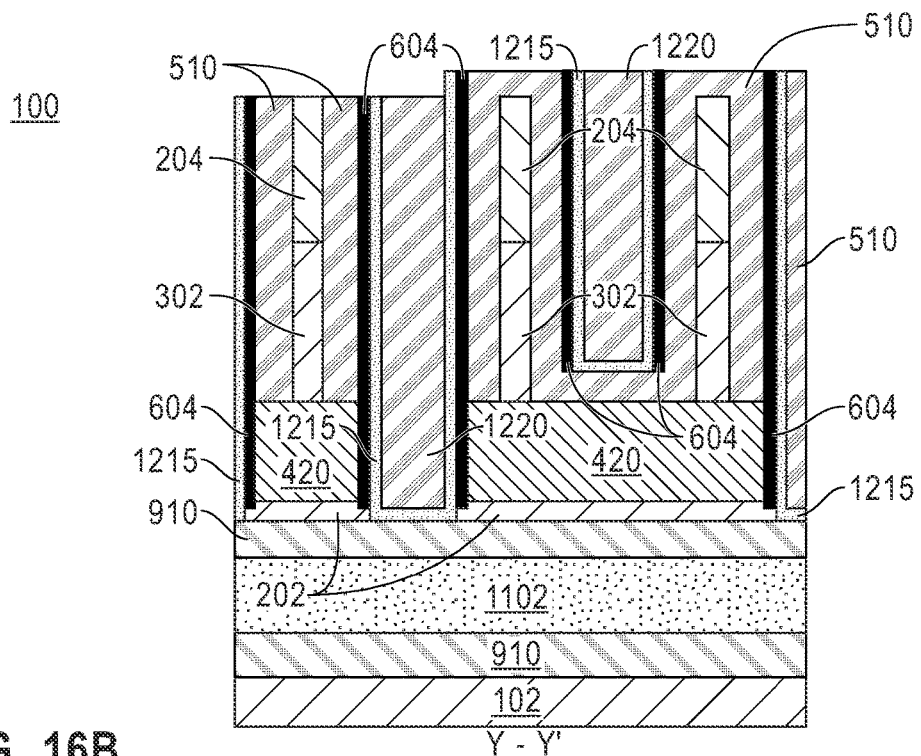
FIG. 16B is a cross-sectional view of the semiconductor structure taken along line Y-Y', as shown in FIG. 1.

Referring now to FIGS. 16A-16B, cross-sectional views of the semiconductor structure 100 are shown after removing the sacrificial spacer 1412, according to an embodiment of the present disclosure. In this embodiment, FIG. 16A is a cross-sectional view of the semiconductor structure 100 taken along line X-X', as depicted in FIG. 1, and FIG. 16B is a cross-sectional view of the semiconductor structure 100 taken along line Y-Y', as depicted in FIG. 1.

In this embodiment, after etching the underlying second semiconductor layer 110, first semiconductor layer 108 and the top portion of the substrate 102, the sacrificial spacer 1412 can be removed from the semiconductor structure 100 using any suitable etching technique.

Figure 17A:
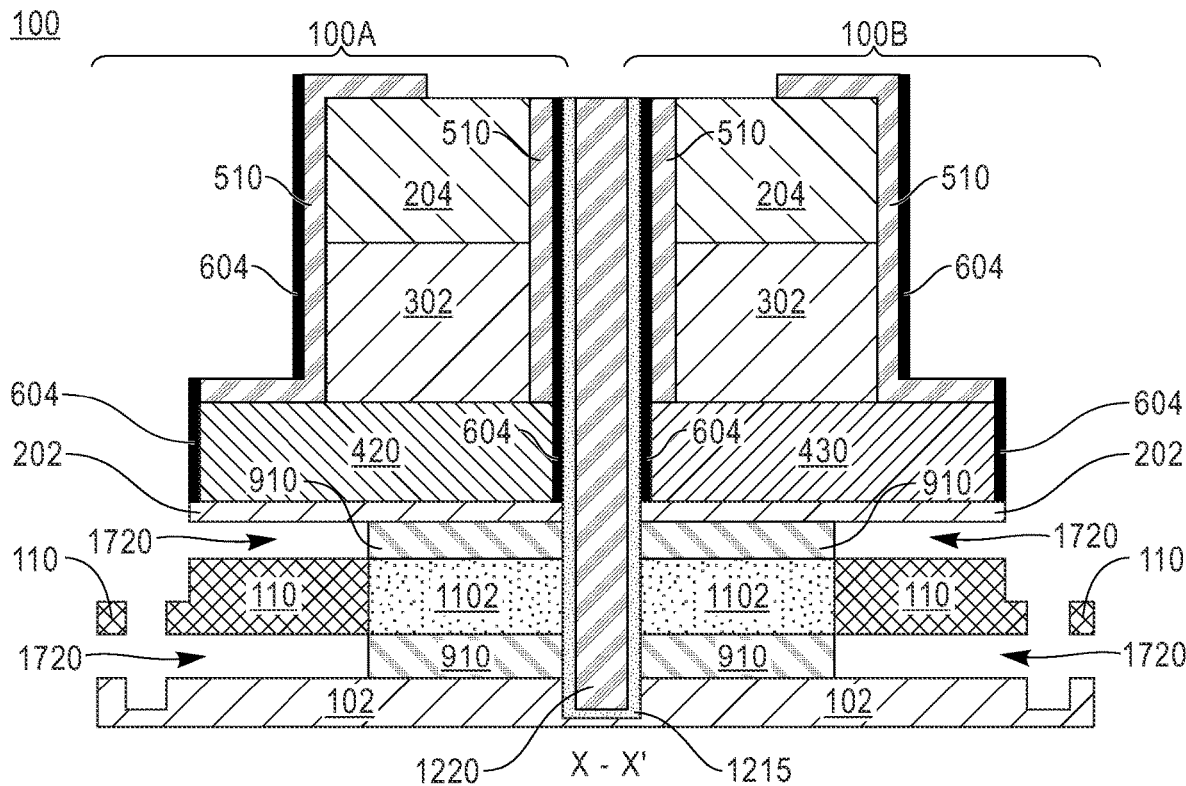
FIG. 17A is a cross-sectional view of the semiconductor structure taken along line X-X', as shown in FIG. 1, depicting recessing outer portions of the first and third semiconductor layers, according to an embodiment of the present disclosure.
Figure 17B:
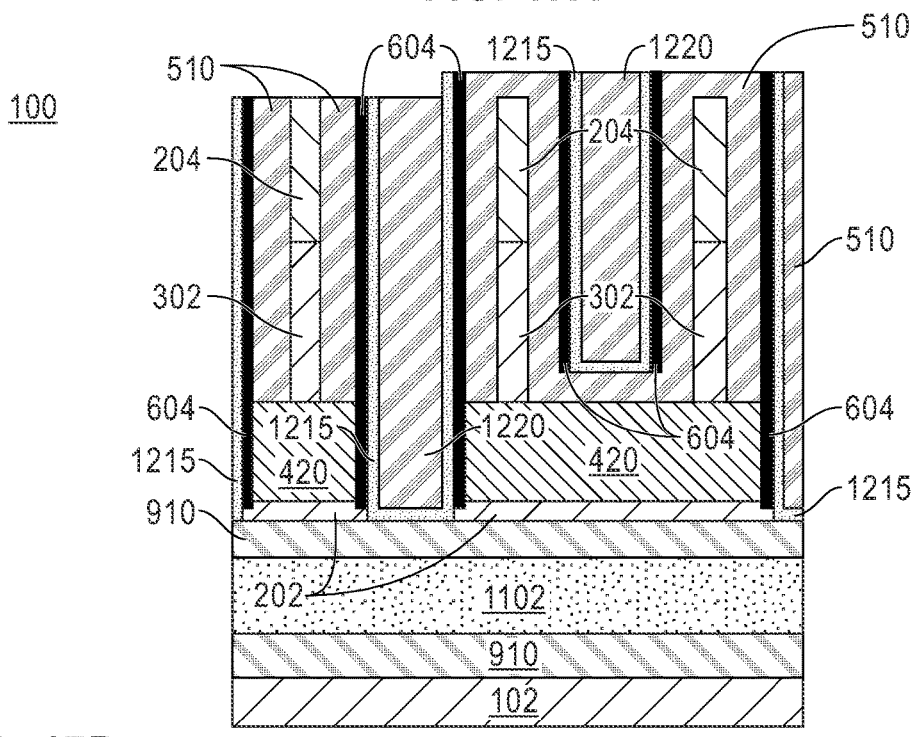
FIG. 17B is a cross-sectional view of the semiconductor structure taken along line Y-Y', as shown in FIG. 1.

Referring now to FIGS. 17A-17B, cross-sectional views of the semiconductor structure 100 are shown after recessing outer portions of the first and third semiconductor layers 108, 112, according to an embodiment of the present disclosure. In this embodiment, FIG. 17A is a cross-sectional view of the semiconductor structure 100 taken along line X-X', as depicted in FIG. 1, and FIG. 17B is a cross-sectional view of the semiconductor structure 100 taken along line Y-Y', as depicted in FIG. 1.

In this embodiment, outer portions of each of the first semiconductor layers 108 and third semiconductor layers 112 are selectively recessed using, for example, a selective etch process such as a hydrogen chloride (HCl) gas etch. Preferably, the selected etch process for recessing the first semiconductor layers 108 and third semiconductor layers 112 is capable of etching silicon germanium without attacking silicon. Etching the outer portions of the first semiconductor layers 108 and third semiconductor layers 112 creates third indented cavities 1720.

Figure 18A:
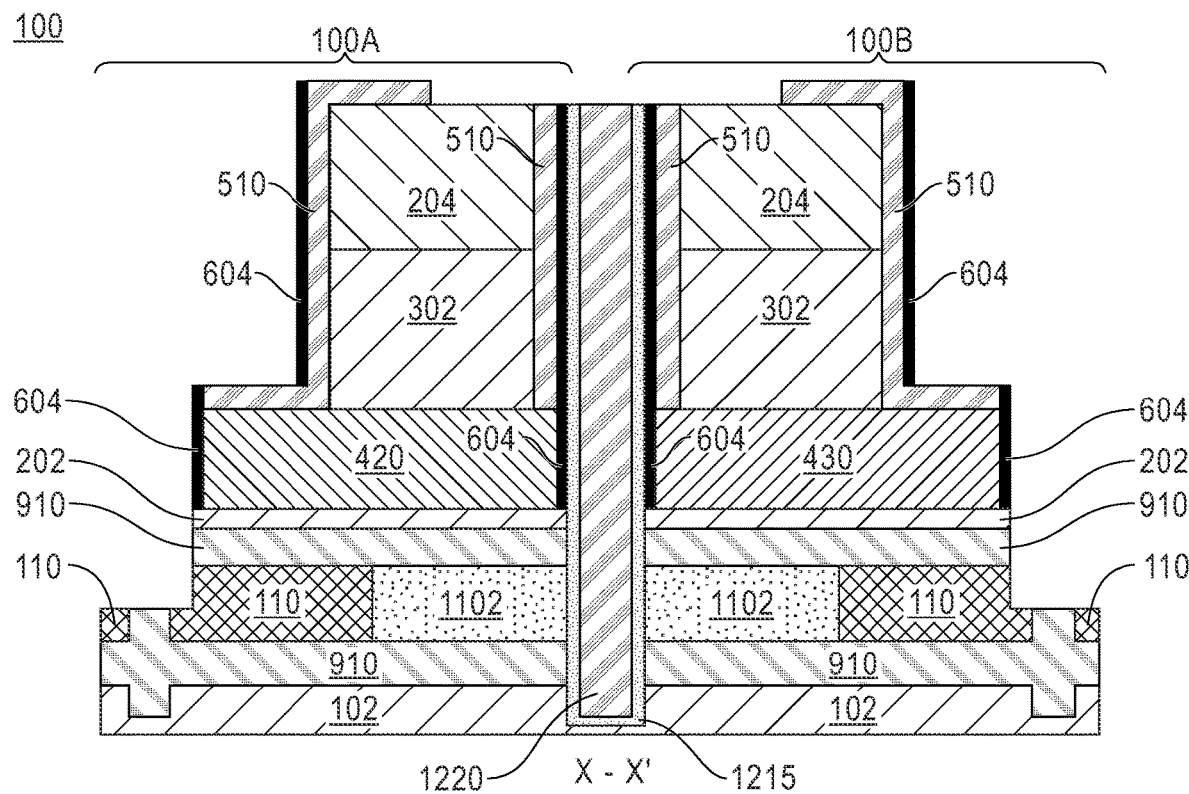
FIG. 18A is a cross-sectional view of the semiconductor structure taken along line X-X', as shown in FIG. 1, depicting forming inner spacers within third indented cavities, according to an embodiment of the present disclosure.
Figure 18B:
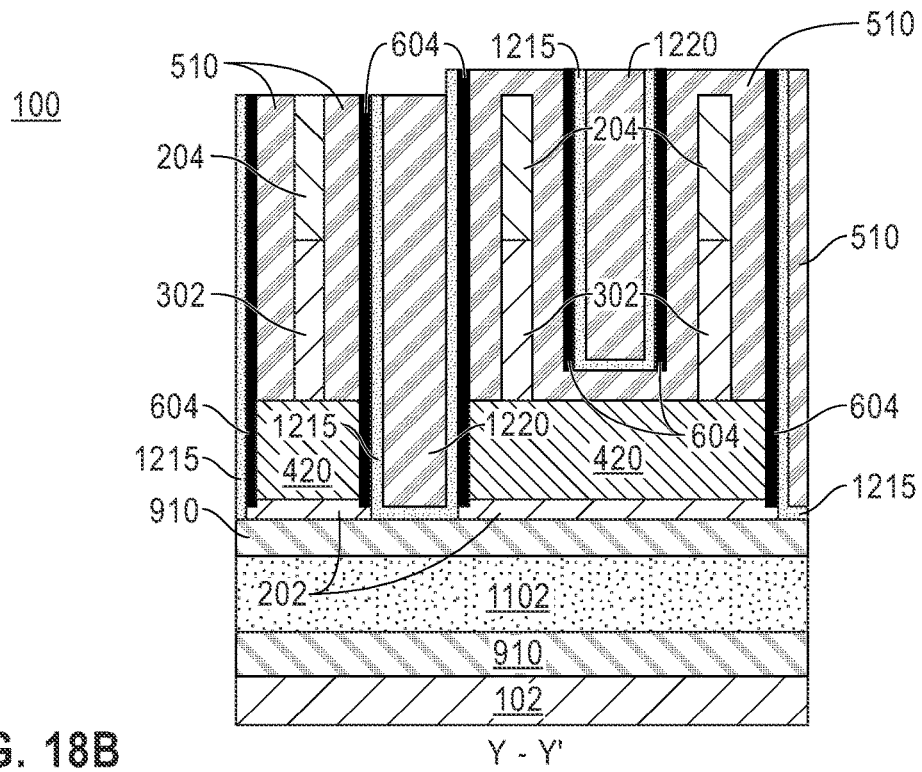
FIG. 18B is a cross-sectional view of the semiconductor structure taken along line Y-Y', as shown in FIG. 1.

Referring now to FIGS. 18A-18B, cross-sectional views of the semiconductor structure 100 are shown after forming inner spacers 910 within the third indented cavities 1720 (FIGS. 17A-17B), according to an embodiment of the present disclosure. In this embodiment, FIG. 18A is a cross-sectional view of the semiconductor structure 100 taken along line X-X', as depicted in FIG. 1, and FIG. 18B is a cross-sectional view of the semiconductor structure 100 taken along line Y-Y', as depicted in FIG. 1.

The inner spacers 910 may be formed within the third indented cavities 1720 (FIGS. 17A-17B) created after etching the outer portions of the first semiconductor layers 108 and third semiconductor layers 112. Similar to the inners spacers 910 formed in FIGS. 9A-9B, an inner spacer dielectric material is conformally deposited to pinch off the third indented cavities 1720 (FIGS. 17A-17B). As mentioned above, the inner spacers 910 may include any suitable dielectric material, such as silicon dioxide, silicon nitride, SiOC, SiOCN, SiBCN, and may include a single layer or multiple layers of dielectric materials. An isotropic etch can then be conducted to remove excess inner spacer material from other regions of the semiconductor structure 100. For ease of illustration, although the inner spacers 910 are formed during two processing steps they are shown as a single-layer inner spacer 910.

Figure 19A:
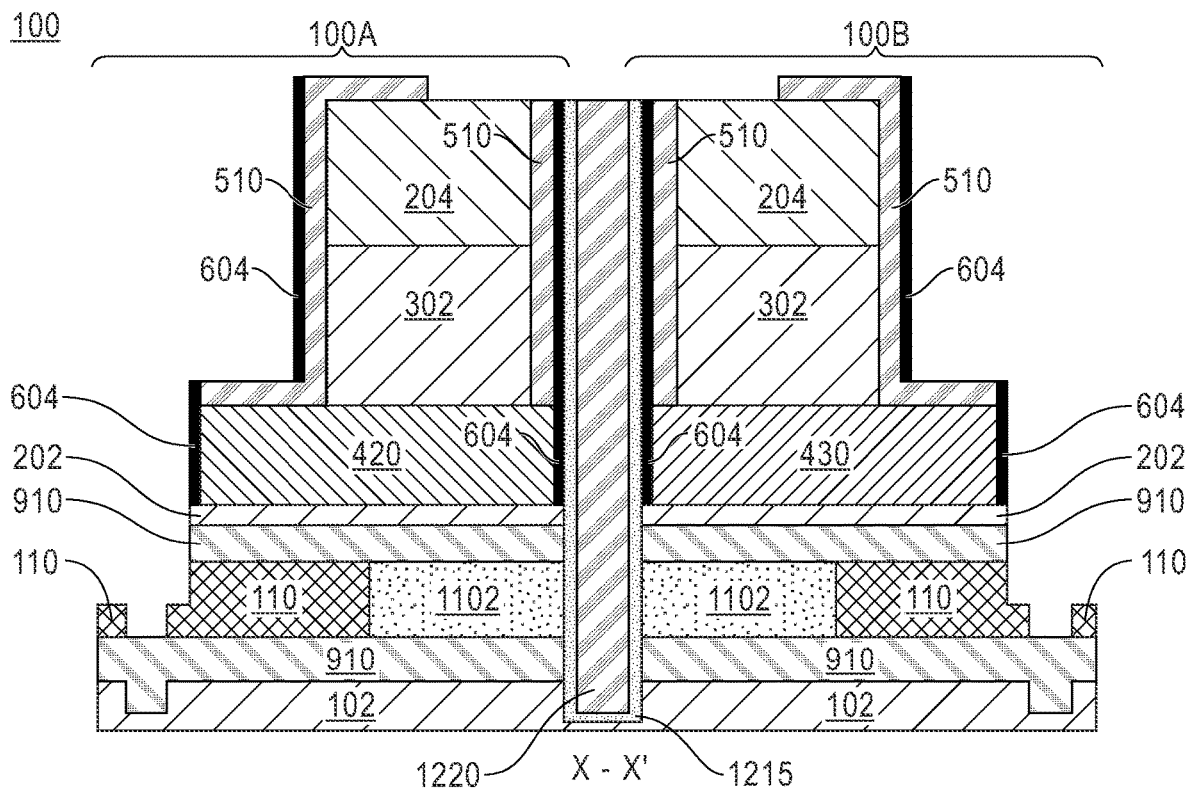
FIG. 19A is a cross-sectional view of the semiconductor structure taken along line X-X', as shown in FIG. 1, depicting recessing a portion of the inner spacers located between remaining areas of the second semiconductor layer, according to an embodiment of the present disclosure.
Figure 19B:
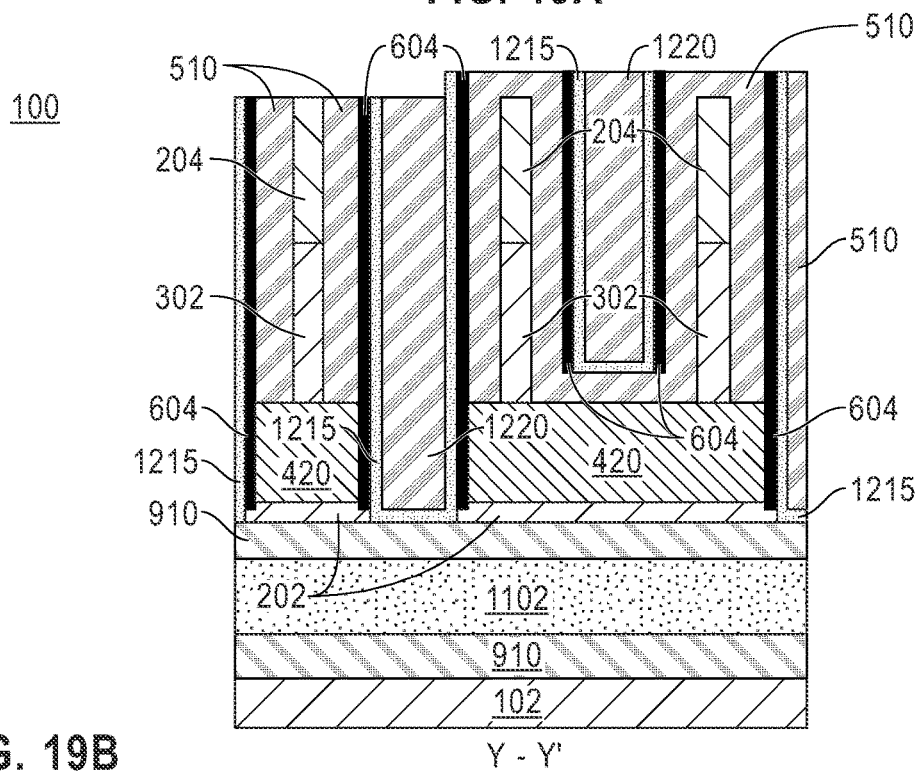
FIG. 19B is a cross-sectional view of the semiconductor structure taken along line Y-Y', as shown in FIG. 1.

Referring now to FIGS. 19A-19B, cross-sectional views of the semiconductor structure 100 are shown after recessing a portion of the inner spacers 910 located between remaining areas of the second semiconductor layer 110, according to an embodiment of the present disclosure. In this embodiment, FIG. 19A is a cross-sectional view of the semiconductor structure 100 taken along line X-X', as depicted in FIG. 1, and FIG. 19B is a cross-sectional view of the semiconductor structure 100 taken along line Y-Y', as depicted in FIG. 1.

Any suitable etching technique, e.g., RIE, can be used to recess the portion of the inner spacers 910 inner spacers 910 located between remaining areas of the second semiconductor layer 110.

Figure 20A:
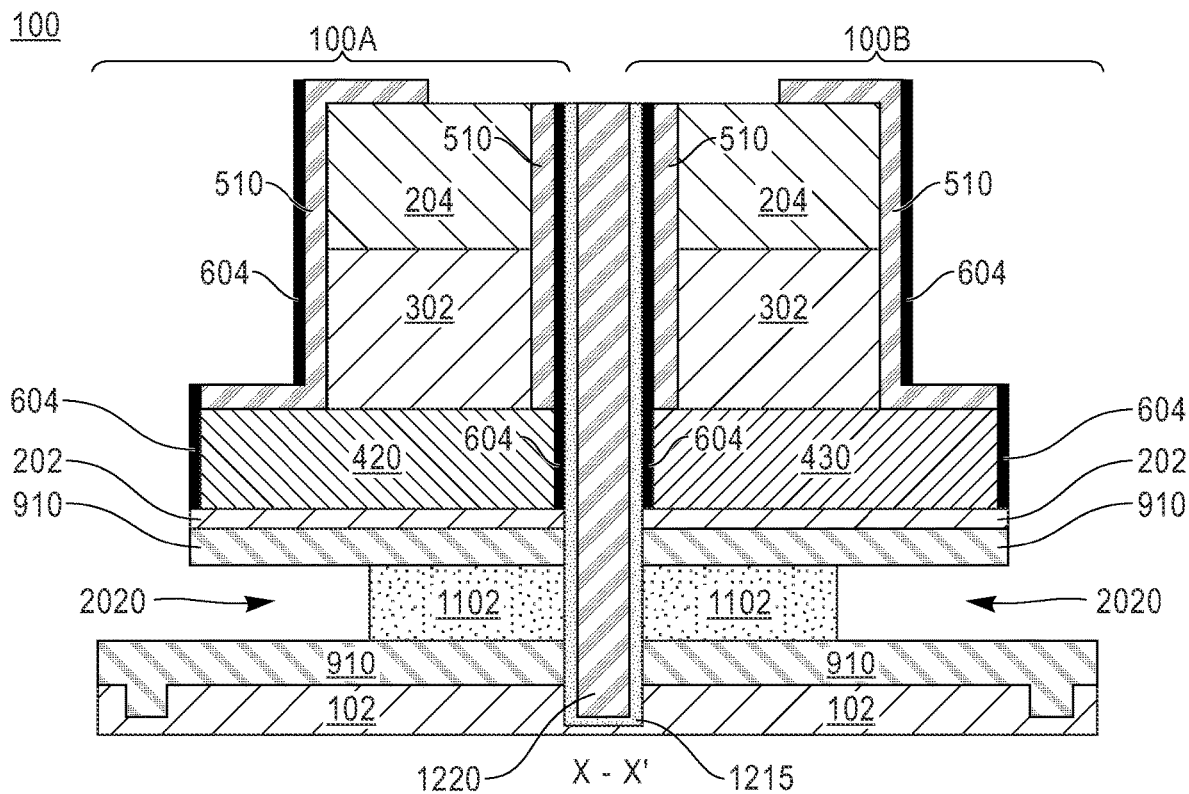
FIG. 20A is a cross-sectional view of the semiconductor structure taken along line X-X', as shown in FIG. 1, depicting removing remaining portions of the second semiconductor layers, according to an embodiment of the present disclosure.
Figure 20B:
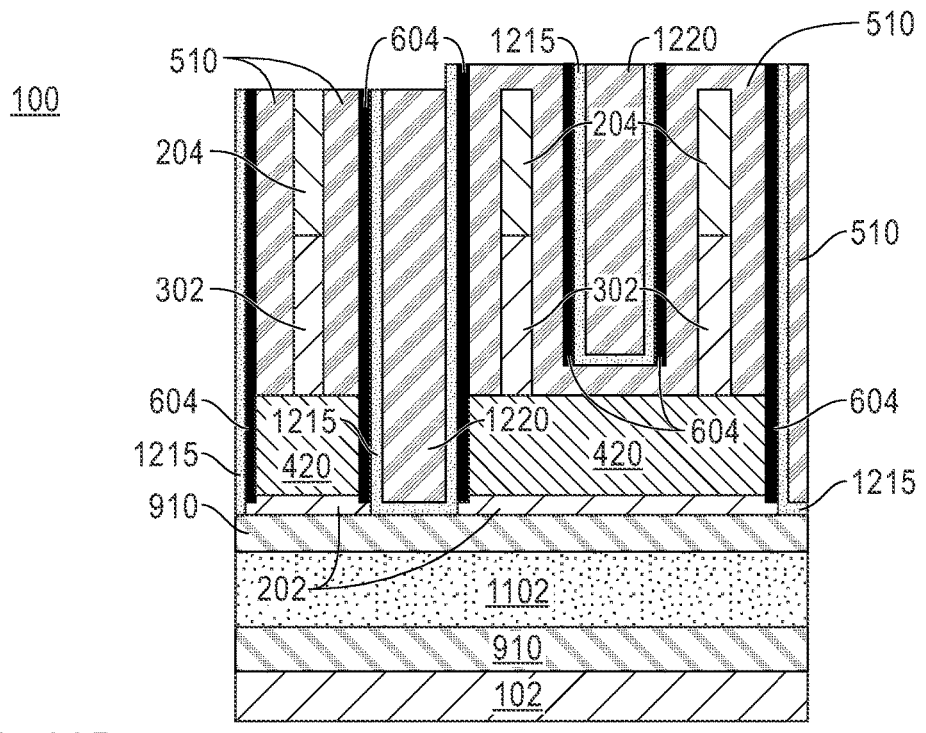
FIG. 20B is a cross-sectional view of the semiconductor structure taken along line Y-Y', as shown in FIG. 1.

Referring now to FIGS. 20A-20B, cross-sectional views of the semiconductor structure 100 are shown after removing remaining portions of the second semiconductor layers 110, according to an embodiment of the present disclosure. In this embodiment, FIG. 20A is a cross-sectional view of the semiconductor structure 100 taken along line X-X', as depicted in FIG. 1, and FIG. 20B is a cross-sectional view of the semiconductor structure 100 taken along line Y-Y', as depicted in FIG. 1.

Remaining portions of the second semiconductor layer 110 in the semiconductor structure 100 are selectively removed using, for example, a selective etch process such as a hydrogen chloride (HCL) gas etch. Preferably, the selected etch process for recessing the second semiconductor layer 110 is capable of etching silicon germanium without attacking silicon. Etching the remaining portions of the second semiconductor layer 110 creates fourth indented cavities 2020.

Figure 21A:
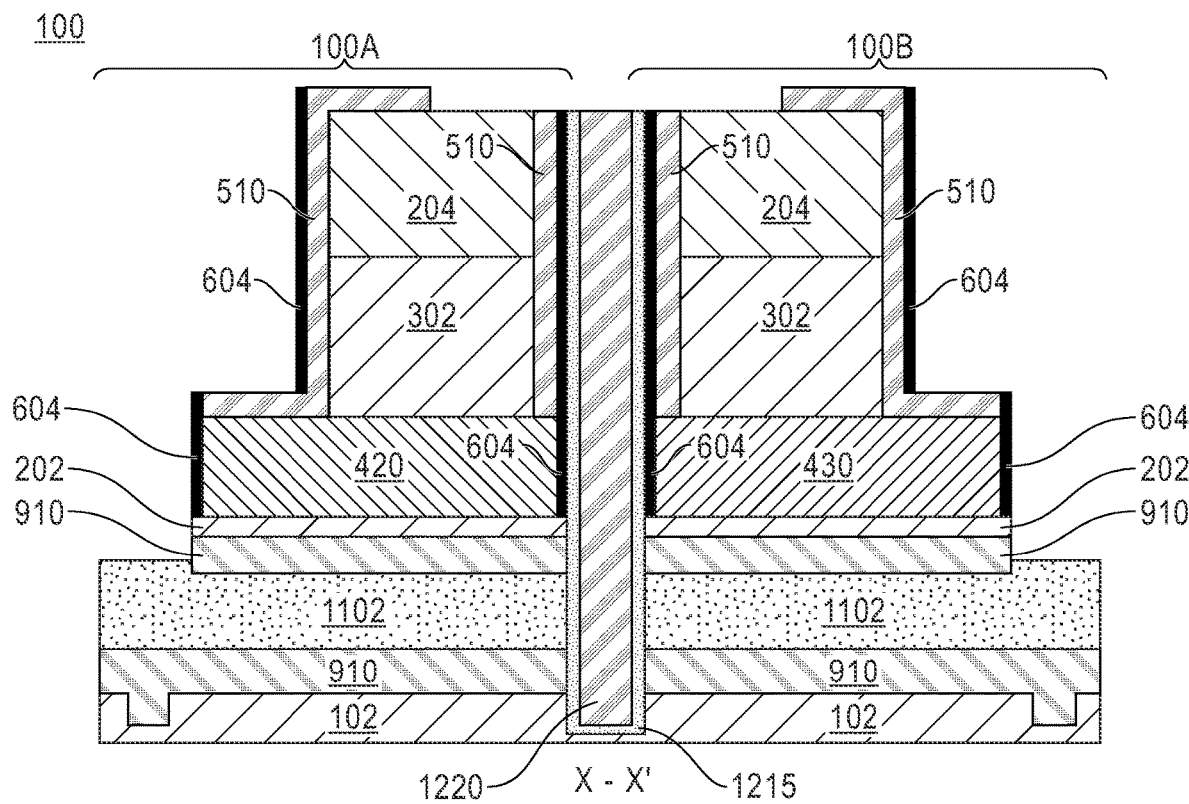
FIG. 21A is a cross-sectional view of the semiconductor structure taken along line X-X', as shown in FIG. 1, depicting forming the first metal layer within fourth indented cavities, according to an embodiment of the present disclosure.
Figure 21B:
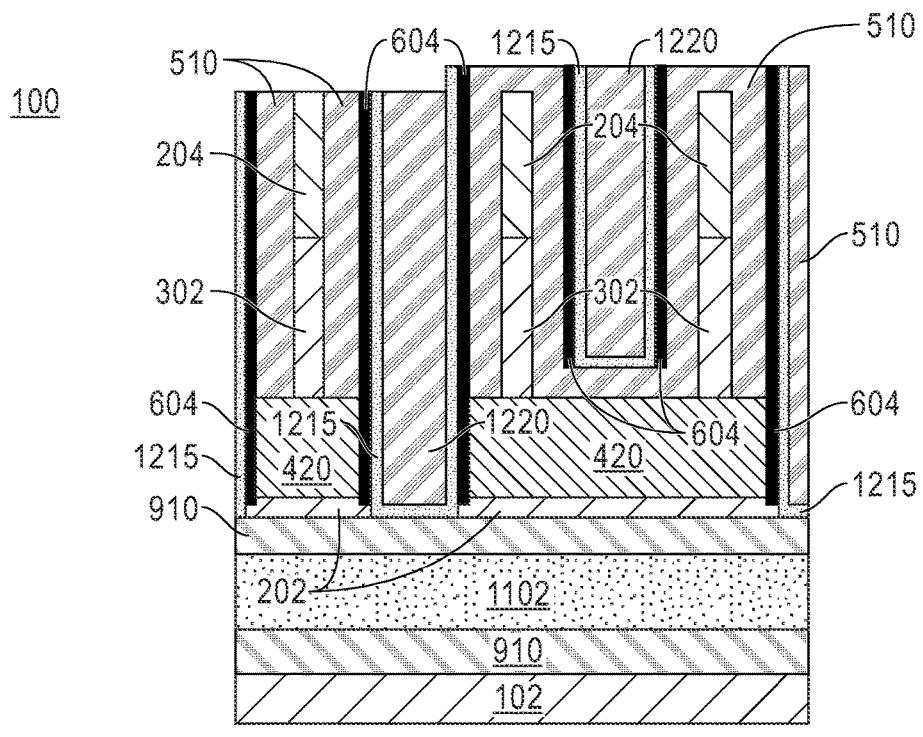
FIG. 21B is a cross-sectional view of the semiconductor structure taken along line Y-Y', as shown in FIG. 1.

Referring now to FIGS. 21A-21B, cross-sectional views of the semiconductor structure 100 are shown after forming the first metal layer 1102 within the fourth indented cavities 2020, according to an embodiment of the present disclosure. In this embodiment, FIG. 21A is a cross-sectional view of the semiconductor structure 100 taken along line X-X', as depicted in FIG. 1, and FIG. 21B is a cross-sectional view of the semiconductor structure 100 taken along line Y-Y', as depicted in FIG. 1.

The first metal layer 1102 may be formed within the fourth indented cavities 2020 (FIGS. 20A-20B) by, for example, blanket deposition of a conductive material that pinches off the fourth indented cavities 2020 (FIGS. 20A-20B). As mentioned above, non-limiting examples of conductive materials for forming the first metal layer 1102 includes Ru, W, or Co. An isotropic etch can then be conducted to remove excess conductive material from other regions of the semiconductor structure 100. For ease of illustration, although the first metal layer 1102 is formed during two processing steps, it is shown as a single first metal layer 1102.

It should be noted that the first metal layer 1102 provides a buried power rail for the semiconductor structure 100. As depicted in the figures, the buried power rail provided by the first metal layer 1102 is formed across an entire length of the semiconductor structure 100 (i.e., CMOS cell) underneath the first and second bottom source/drain regions 420, 430. This configuration allows the semiconductor structure 100 to be formed with full device footprint. As depicted in FIG. 21A, the inner spacer 910 covers an entire bottom surface of the first metal layer 110, while the inner spacer 910 partially covers a top surface of the first metal layer 1102. Specifically, an outer top surface of the first metal layer 1102 adjacent to the first and second bottom source/drain regions 420, 430 is not covered by the inner spacer 910. According to an embodiment, the inner spacer(s) 910 isolate the first metal layer 1102 (i.e. buried power rail) from the first and second source/drain regions 420, 430.

Figure 22A:
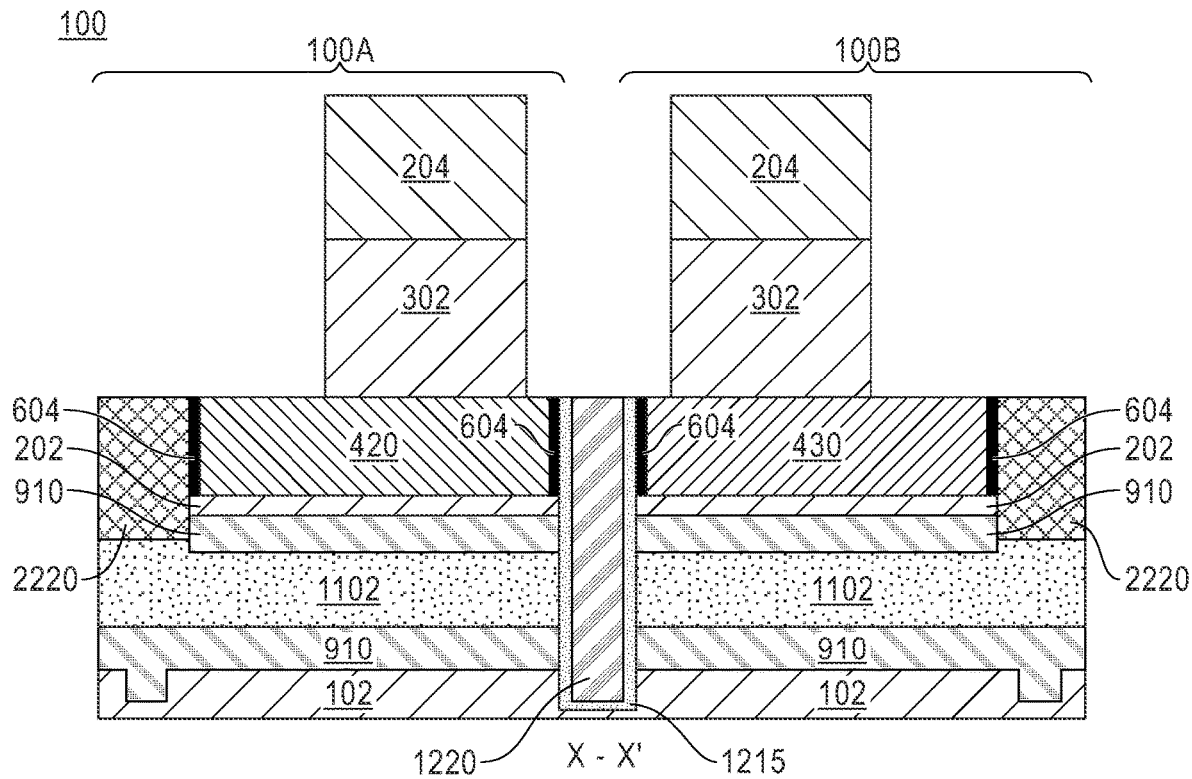
FIG. 22A is a cross-sectional view of the semiconductor structure taken along line X-X', as shown in FIG. 1, depicting forming an oxide overfill and forming shallow trench isolation regions, according to an embodiment of the present disclosure.
Figure 22B:
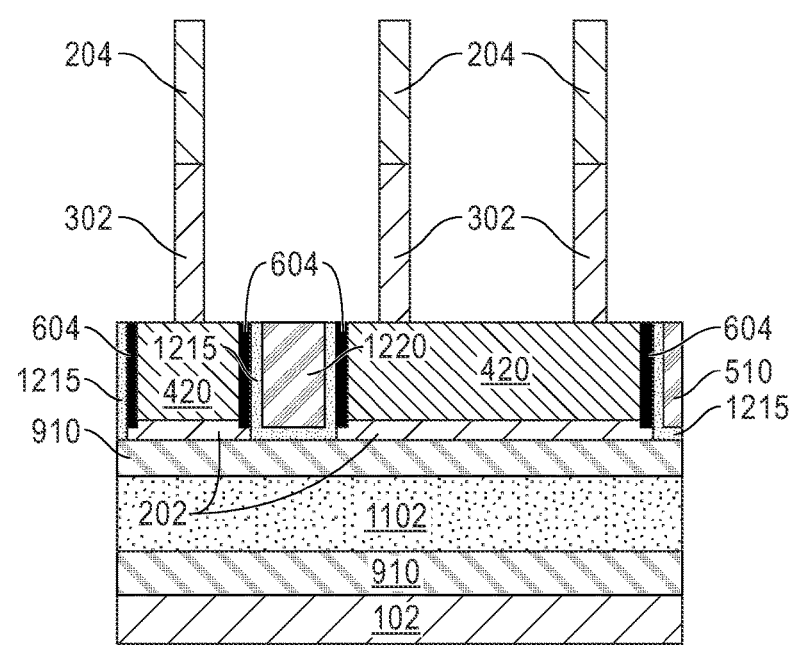
FIG. 22B is a cross-sectional view of the semiconductor structure taken along line Y-Y', as shown in FIG. 1.

Referring now to FIGS. 22A-22B, cross-sectional views of the semiconductor structure 100 are shown after an oxide overfill and forming shallow trench isolation (STI) regions, according to an embodiment of the present disclosure. In this embodiment, FIG. 22A is a cross-sectional view of the semiconductor structure 100 taken along line X-X', as depicted in FIG. 1, and FIG. 22B is a cross-sectional view of the semiconductor structure 100 taken along line Y-Y', as depicted in FIG. 1.

At this step of the manufacturing process, known processing techniques have been applied to the semiconductor structure 100. It should be noted that standard processing steps are not described in detail in order to avoid unnecessarily obscuring the presented embodiments. After forming the first metal layer 1102 within the fourth indented cavities 2020 (FIGS. 20A-20B) to provide a buried power rail, an insulator material is formed on the semiconductor structure using any deposition method known in the art. The insulator material substantially fills a space located above the exposed top surface of the first metal layer 1102 and adjacent to the first and second bottom source/drain regions 420, 430 for forming shallow trench isolation (STI) regions 2220. Shallow trench isolation regions, such as the STI regions 2220, are frequently used in semiconductor technology to separate active regions within the semiconductor substrate 102 and prevent electric current leakage between adjacent components. Thus, the STI regions 2220 are configured and arranged as shown in FIG. 22A to electrically isolate active regions of the semiconductor structure 100. As may be known by those skilled in the art, a planarization process (e.g., CMP) followed by an etching process (e.g., RIE) is conducted on the deposited insulator material to form the STI regions 2220 as depicted in the figures.

In some embodiments, the insulator material used to form the STI regions 2220 may consist of any low-k dielectric material including, but not limited to, silicon nitride, silicon oxide, silicon oxy-nitride and fluoride-doped silicate glass.

It should be noted that remaining portions of the dielectric fill layer 1220 and the nitride liner 1215 electrically isolate active regions of the first region 100A from active regions of the second region 100B.

As can be appreciated in the figures, the spacer 510 is removed from the semiconductor structure 100 along with the portions of the protective liner 604 in contact with the spacer 510. Portions of the protective liner 604 in contact with the first and second bottom source/drain regions 420, 430 remain in the semiconductor structure 100. Removal of the spacer 510 and protective liner 604 exposes the channel fin 302 and the hardmask layer 204.

Figure 23A:
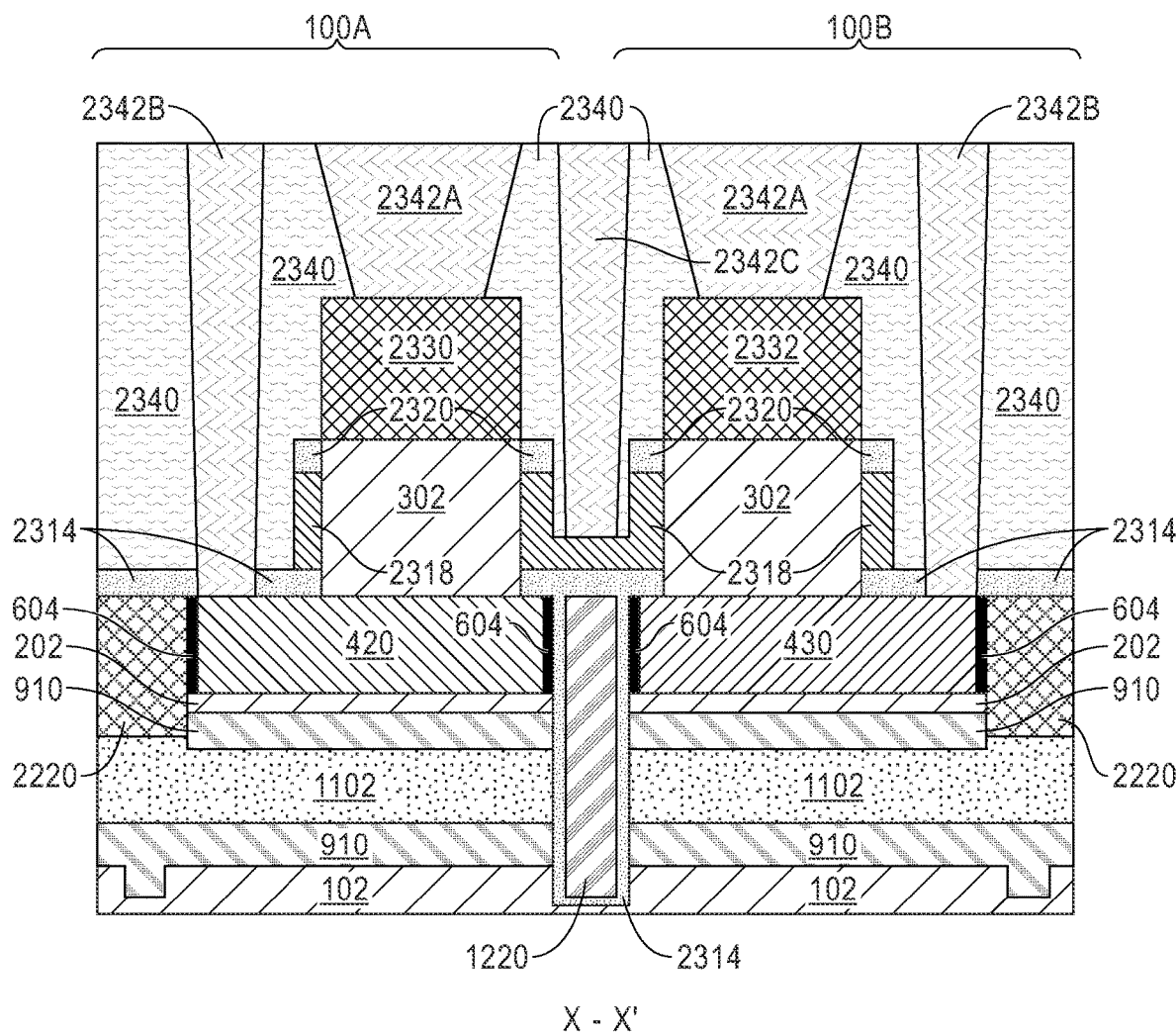
FIG. 23A is a cross-sectional view of the semiconductor structure taken along line X-X', as shown in FIG. 1, depicting contact metallization, according to an embodiment of the present disclosure.
Figure 23B:
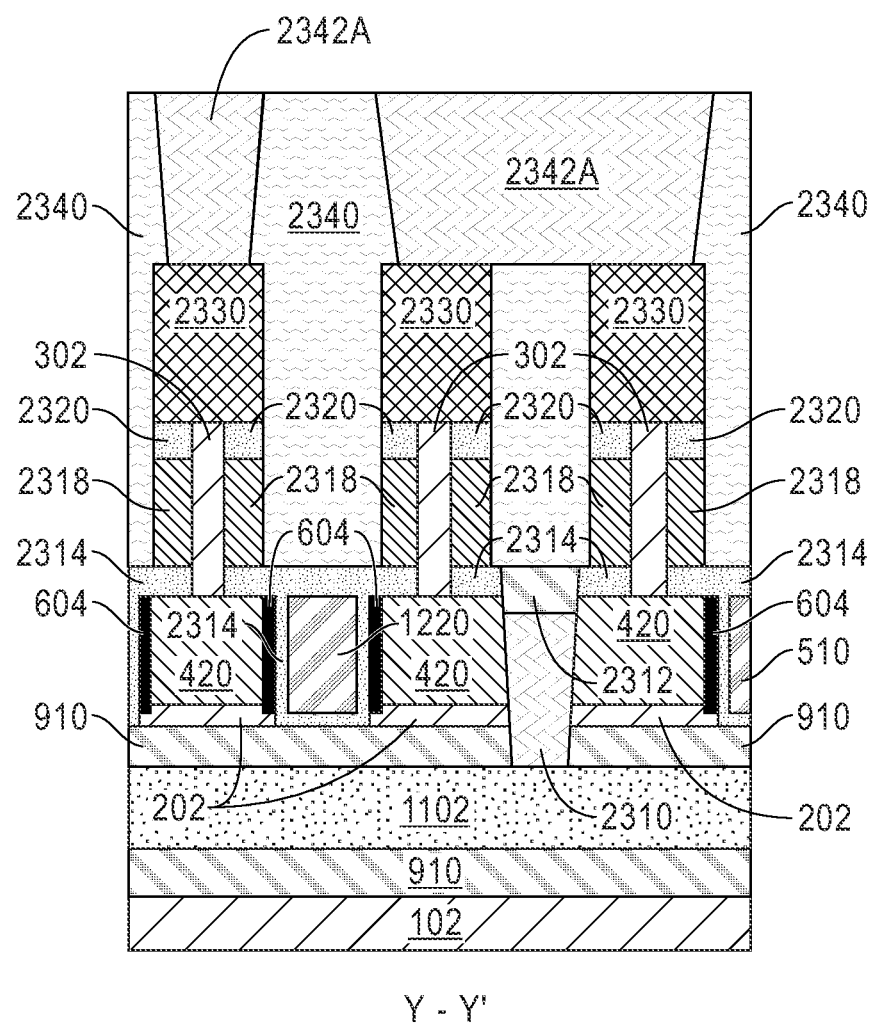
FIG. 23B is a cross-sectional view of the semiconductor structure taken along line Y-Y', as shown in FIG. 1.

Referring now to FIGS. 23A-23B, cross-sectional views of the semiconductor structure 100 are shown after contact metallization, according to an embodiment of the present disclosure. In this embodiment, FIG. 23A is a cross-sectional view of the semiconductor structure 100 taken along line X-X', as depicted in FIG. 1, and FIG. 23B is a cross-sectional view of the semiconductor structure 100 taken along line Y-Y', as depicted in FIG. 1.

At this step of the manufacturing process, known processing techniques have been applied to the semiconductor structure 100. It should be noted that standard processing steps are not described in detail in order to avoid unnecessarily obscuring the presented embodiments. For example, in this embodiment, a bottom spacer 2314 is formed above each of the first bottom source/drain region 420 and the second bottom source/drain region 430 and along opposite sidewalls of a bottom portion of each of the channel fins 302. The bottom spacer 2314 also covers an uppermost surface of the STI regions 2220.

The bottom spacer 2314 can include a dielectric material, such as, for example, SiN, SiC, SiOC, SiCN, BN, SiBN, SiBCN, SiOCN, SiOxNy, and combinations thereof. The dielectric material can be a low-k material having a dielectric constant less than about 7, less than about 5, or even less than about 2.5. The bottom spacer 2314 can be formed using combinations of known deposition and etching processes, such as, for example, chemical vapor deposition (CVD), plasma-enhanced chemical vapor deposition (PECVD), atomic layer deposition (ALD), physical vapor deposition (PVD), chemical solution deposition, and etching processes including reactive ion etch (RIE), wet etch, or isotropic vapor phased dry etch.

In one or more embodiments, a first conducting via 2310 is formed for electrically connecting the first metal layer 1102 (i.e., buried power rail) and the first bottom source/drain region 420, as depicted in FIG. 23B. Although not shown in the figures, it may be understood that a second conducting via (not shown) can be formed on the second region 100B for electrically connecting the second bottom source/drain region 430 and to the first metal layer 1102. A dielectric cap 2312 can be formed above the first conducting via 2310.

A metal gate stack 2318 is formed along opposite sidewalls of each of the channel fins 302 in both the first region 100A and the second region 100B. As illustrated in the figure, the metal gate stack 2318 is formed in direct contact with the channel fins 302. For ease of illustration, the metal gate stack 2318 is depicted as only one layer. However, as known by those skilled in the art, the metal gate stack 2318 can include a gate dielectric and a gate conductor/metal (e.g., a work function metal (WFM)) deposited over the bottom spacer 2314 and adjacent to a portion of the channel fins 302. In some embodiments, the metal gate stack 2318 is deposited by atomic layer deposition (ALD).

The gate dielectric (not shown) can be formed from one or more gate dielectric films. The gate dielectric films can be a dielectric material having a dielectric constant greater than, for example, 3.9, 7.0, or 10.0. Non-limiting examples of suitable materials for the high-k dielectric films include oxides, nitrides, oxynitrides, silicates (e.g., metal silicates), aluminates, titanates, nitrides, or any combination thereof. Examples of high-k materials with a dielectric constant greater than 7.0 include, but are not limited to, metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The gate dielectric films can further include dopants such as, for example, lanthanum and aluminum. The gate dielectric films can be formed by suitable deposition processes, for example, CVD, PECVD, ALD, PVD, chemical solution deposition, or other like processes. The thickness of the gate dielectric films can vary depending on the deposition process as well as the composition and number of high-k dielectric materials used.

The gate conductor (not shown) in the metal gate stack 2318 can include doped polycrystalline or amorphous silicon, germanium, silicon germanium, a metal (e.g., tungsten, titanium, tantalum, ruthenium, zirconium, cobalt, copper, aluminum, lead, platinum, tin, silver, gold), a conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), carbon nanotube, conductive carbon, graphene, or any suitable combination of these materials. The conductive material can further include dopants that are incorporated during or after deposition. In some embodiments, the gate conductor can be a WFM deposited over the gate dielectric films by a suitable deposition process, for example, CVD, PECVD, PVD, plating, thermal or e-beam evaporation, and sputtering. The type of WFM depends on the type of transistor and can differ between n-FET and p-FET devices. P-type WFMs include compositions such as titanium nitride (TiN), ruthenium, palladium, platinum, cobalt, nickel, and conductive metal oxides, or any combination thereof. N-type WFMs include compositions such as titanium carbide (TiC), titanium aluminum carbide (TiAlC), hafnium, zirconium, titanium, tantalum, aluminum, metal carbides (e.g., hafnium carbide, zirconium carbide, titanium carbide, and aluminum carbide), aluminides, or any combination thereof. The gate conductor can further include a tungsten (W), titanium (Ti), aluminum (Al), cobalt (Co), or nickel (Ni) material over the WFM layer of the gate conductor. The gate conductor can be deposited by a suitable deposition process, for example, CVD, PECVD, PVD, plating, thermal or e-beam evaporation, and sputtering.

In this embodiment, the metal gate stack 2318 is conformally deposited on the semiconductor structure 100, After deposition of the metal gate stack 2318, a patterning process is conducted on the semiconductor structure 100 to etch the unwanted metal gate stack 2318, With continued reference to FIGS. 23A-23B, a top spacer 2320 is formed above the metal gate stack 2318 on opposite sides of a top portion of the channel fins 302. In one or more embodiments, the top spacer 2320 may be deposited using, for example, CVD, PECVD, radio-frequency CVD (RFCVD), PVD, ALD, molecular layer deposition (MLD), molecular beam deposition (MBD), pulsed laser deposition (PLD), liquid source misted chemical deposition (LSMCD), sputtering, and/or plating. Non-limiting examples of materials forming the top spacer 2320 may include silicon nitride (SiN), silicon boron nitride (SiBN), siliconborocarbonitride (SiBCN), or silicon oxycarbonitride (SiOCN). Any suitable etching technique (e.g., RIE) may be used to remove the top spacer 2320 from top surfaces of the channel fins 302, as depicted in the figure.

It should be noted that although bottom spacer 2314 and top spacer 2320 are depicted on adjacent opposite sides of the channel fins 302, the bottom spacer 2314 and the top spacer 2320 surround an entire surface of the channel fins 302. The bottom spacer 2314 and the top spacer 2320 may determine a location of junctions in the semiconductor structure 100.

As may be understood, the various elements that form the semiconductor structure 100 extend along a first axis (e.g., X-axis) to define width dimensions, and extend along a second axis (e.g., Y-axis) perpendicular to the X-axis to define height (or thickness) dimensions. Although not specifically depicted in the cross-sectional views shown in FIGS. 23A-23B, the various elements that form the semiconductor structure 100 also extend along a third axis (e.g., Z-axis) perpendicular to the first axis and the second axis to define depth dimensions. In accordance with standard VFET architectures, various elements of the semiconductor structure 100 (e.g., bottom spacer 2314, metal gate stack 2318, etc.) extend completely around the sidewalls of the channel fins 302 in the X, Y, and Z directions.

According to an embodiment, first top source/drain regions 2330 and second top source/drain regions 2332 are formed in the first region 100A and the second region 100B, respectively. Prior to forming the first top source/drain regions 2330 and second top source/drain regions 2332, the hardmask layer 204 (FIGS. 22A-22B) is removed from semiconductor structure 100 using standard etching techniques. The first top source/drain regions 2330 and second top source/drain regions 2332 can be epitaxially grown off the exposed portion of the channel fins 302. The epitaxial process used to form the first top source/drain regions 2330 and second top source/drain regions 2332 is similar to the one described above with reference to the first and second bottom source/drain regions 420, 430 and may include selective epitaxial growth of an in-situ p-type or n-type doped material on the exposed surfaces of the channel fins 302.

As known by those skilled in the art, an interlevel dielectric (ILD) layer 2342 is formed to fill voids between gate structures and other existing devices within the semiconductor structure 100 and in preparation for contact formation. The ILD layer 2342 may be formed by, for example, CVD of a dielectric material. Non-limiting examples of dielectric materials to form the ILD layer 2342 may include silicon oxide, silicon nitride, hydrogenated silicon carbon oxide, silicon based low-k dielectrics, flowable oxides, porous dielectrics, or organic dielectrics including porous organic dielectrics.

Typically, after deposition of the ILD layer 2342, a chemical mechanical polishing (CMP) process is conducted on the semiconductor structure 100. Contact trenches (not shown) can be formed within the ILD layer 2342 using well-known lithography and reactive ion etch (ME) processing.

As known by those skilled in the art, patterning of the ILD layer 2342 to form the contact trenches (not shown) involves exposing a pattern on a photoresist layer and transferring the exposed pattern to the ILD layer 2342, as shown in the figures. After transferring the pattern and forming the contact trenches, the photoresist layer can be removed using any photoresist striping method known in the art including, for example, plasma asking.

Top source/drain contacts 2342A (i.e., CA contacts) are formed within contact trenches extending all the way until an uppermost surface of the first top source/drain regions 2330 and an uppermost surface of the second top source/drain region 2332.

Similarly, bottom source/drain contacts 2342B (i.e., CR contacts) are formed within contact trenches extending all the way through an uppermost surface of the first bottom source/drain regions 420 and an uppermost surface of the second bottom source/drain regions 430. Gate contacts 2342C are formed within contact trenches extending all the way through the metal gate stack 2318. The process of forming metal contacts is standard and well-known in the art. Typically, the process includes patterning the contact trenches and filling the patterned contact trenches with a conductive material or a combination of conductive materials. The conductive material filling the top source/drain contacts 2342A, bottom source/drain contacts 2342B, and gate contacts 2342C includes a conductive metal, for example, aluminum (Al), platinum (Pt), gold (Au), tungsten (W), titanium (Ti), cobalt (Co), ruthenium (Ru), copper (Cu), or any combination thereof. It should be noted that, in some embodiments, an adhesion metal liner (not shown) may be used before conductive metal depth, such as TiN, TaN, etc. The conductive material may be deposited by a suitable deposition process, for example, CVD, PECVD, PVD, plating, thermal or e-beam evaporation, or sputtering. A planarization process such as CMP is generally performed to remove any conductive material from surfaces of the semiconductor structure 100.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the disclosure. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof. "Optional" or "optionally" means that the subsequently described event or circumstance may or may not occur, and that the description includes instances where the event occurs and instances where it does not.

Spatially relative terms, such as "inner," "outer," "beneath," "below," "lower," "above," "upper," "top," "bottom," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below" or "beneath" other elements or features would then be oriented "above" the other elements or features. Thus, the example term "below" may encompass both an orientation of above and below. The device may be otherwise oriented (rotated 90 degrees or at other orientations) and the spatially relative descriptors used herein interpreted accordingly.

Approximating language, as used herein throughout the specification and claims, may be applied to modify any quantitative representation that could permissibly vary without resulting in a change in the basic function to which it is related. Accordingly, a value modified by a term or terms, such as "about", "approximately" and "substantially", are not to be limited to the precise value specified. In at least some instances, the approximating language may correspond to the precision of an instrument for measuring the value. Here and throughout the specification and claims, range limitations may be combined and/or interchanged, such ranges are identified and include all the sub-ranges contained therein unless context or language indicates otherwise. "Approximately" as applied to a particular value of a range applies to both values, and unless otherwise dependent on the precision of the instrument measuring the value, may indicate +/−10% of the stated value(s).

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A semiconductor structure comprising:
   a channel fin extending vertically above a bottom source/drain region;
   a protective liner along opposite sidewalls of the bottom source/drain region, the bottom source/drain region located above a semiconductor layer in contact with a first portion of an inner spacer;
   a first metal layer located between the first portion of the inner spacer and a second portion of the inner spacer, the first portion of the inner spacer partially covering a top surface of the first metal layer and the second portion of the inner spacer substantially covering a bottom surface of the first metal layer for providing a buried power rail; and a shallow trench isolation region above an exposed portion of the first metal layer, the shallow trench isolation region being adjacent to the first portion of the inner spacer, the semiconductor layer, and the bottom source/drain region.

2. The semiconductor structure of claim 1, further comprising:

a bottom spacer above the shallow trench isolation region and above the bottom source/drain region, the bottom spacer disposed on a bottom portion of opposite sidewalls of the channel fin.

3. The semiconductor structure of claim 2, further comprising:

a top source/drain region in contact with a top portion of the channel fin; and a metal gate located around the channel fin, the metal gate being separated from the top source/drain region by a top spacer and from the bottom source/drain region by the bottom spacer, the metal gate and the top spacer being in contact with an adjacent interlevel dielectric layer.

4. The semiconductor structure of claim 3, further comprising:

a top source/drain contact extending through the interlevel dielectric layer until an uppermost surface of the top source/drain region;

a bottom source/drain contact extending through the interlevel dielectric layer until an uppermost surface of the bottom source/drain region; and a gate contact extending through the interlevel dielectric layer until an uppermost surface of the metal gate.

5. The semiconductor structure of claim 1, further comprising:

a conductive via extending through the bottom source/drain region until a to portion of the first metal layer; and a dielectric cap above the conductive via.

6. The semiconductor structure of claim 1, wherein the first metal layer is composed of a low-resistance conductive material including at least one of ruthenium, tungsten and cobalt.

7. The semiconductor structure of claim 1, wherein the protective liner comprises a conformally deposited liner material for protecting the bottom source/drain region.

8. The semiconductor structure of claim 1, further comprising:

an isolation region located in a p-n boundary region, the isolation region separating adjacent bottom source/drain regions and extending through the semiconductor layer, the first portion of the inner spacer, the first metal layer and the second portion of the inner spacer until a top portion of a substrate disposed below the second portion of the inner spacer.

9. The semiconductor structure of claim 8, wherein the isolation region further comprises:

a nitride liner; and a dielectric fill layer disposed above the nitride liner.

10. A semiconductor structure comprising:

a first region including a first channel fin extending vertically above a first bottom source/drain region;

a second region including a second channel fin extending vertically above a second bottom source/drain region, the first region being separated from the second region by an isolation region;

a protective liner along opposite sidewalls of each of the first bottom source/drain region and the second bottom/source drain region, each of the first bottom source/drain region and the second bottom/source drain region located above a semiconductor layer in contact with a first portion of an inner spacer;

a first metal layer located between the first portion of the inner spacer and a second portion of the inner spacer, the first portion of the inner spacer partially covering a top surface of the first metal layer and the second portion of the inner spacer substantially covering a bottom surface of the first metal layer for providing a buried power rail; and a shallow trench isolation region above an exposed portion of the first metal layer, the shallow trench isolation region being adjacent to the first portion of the inner spacer, the semiconductor layer, and each of the first bottom source/drain region and the bottom source/drain region.

11. The semiconductor structure of claim 10, further comprising:

a bottom spacer above the shallow trench isolation region, the isolation region and above each of the first bottom source/drain region and the second bottom source/drain region, the bottom spacer disposed on a bottom portion of opposite sidewalls of each of the first channel fin and the second channel fin.

12. The semiconductor structure of claim 11, further comprising:

a first top source/drain region in contact with a top portion of the first channel fin;

a second top source/drain region in contact with a top portion of the second channel fin; and a metal gate located around each of the first channel fin and the second channel fin, the metal gate being separated from the first top source/drain region and the second top source/drain region by a top spacer and from the first bottom source/drain region and the second bottom source/drain region by the bottom spacer, the metal gate and the top spacer being in contact with an adjacent interlevel dielectric layer.

13. The semiconductor structure of claim 12, further comprising:

a top source/drain contact extending through the interlevel dielectric layer until an uppermost surface of each of the first top source/drain region and the second top source/drain region;

a bottom source/drain contact extending through the interlevel dielectric layer until an uppermost surface of each of the first bottom source/drain region and the second bottom source/drain region; and a gate contact extending through the interlevel dielectric layer until an uppermost surface of the metal gate.

14. The semiconductor structure of claim 10, further comprising:

a conductive via extending through the first bottom source/drain region and the second bottom source/drain region until a top portion of the first metal layer; and a dielectric cap above the conductive via.

15. The semiconductor structure of claim 10, wherein the first metal layer is composed of a low-resistance conductive material including ruthenium.

16. The semiconductor structure of claim 10, wherein the protective liner comprises a conformally deposited liner material for protecting the bottom source/drain region.

17. The semiconductor structure of claim 10, wherein the isolation region is located in a p-n boundary region, the isolation region separating the first bottom source/drain region and the second bottom source/drain region and extending through the semiconductor layer, the first portion of the inner spacer, the first metal layer and the second portion of the inner spacer until a top portion of a substrate disposed below the second portion of the inner spacer.

18. The semiconductor structure of claim 17, wherein the isolation region further comprises:
   a nitride liner; and
   a dielectric fill layer disposed above the nitride liner.

19. The semiconductor structure of claim 18, wherein the nitride liner is composed of a silicon nitride material and the dielectric fill layer is composed of silicon dioxide.

20. The semiconductor structure of claim 10, wherein the first region comprises a p-FET region and the second region comprises an n-FET region.

* * * * *